United States Patent
Nam et al.

(10) Patent No.: US 12,276,691 B2
(45) Date of Patent: Apr. 15, 2025

(54) DEVICE AND METHOD FOR MONITORING FUNCTION CIRCUIT AND OUTPUTTING RESULT OF MONITORING

(71) Applicant: SAMSUNG ELECTRONICS CO., LTD., Suwon-si (KR)

(72) Inventors: Hyunseok Nam, Hwaseong-si (KR); Yus Ko, Yongin-si (KR); Sangho Kim, Seongnam-si (KR); Jaehyuk Yang, Gunpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 18/094,860

(22) Filed: Jan. 9, 2023

(65) Prior Publication Data
US 2023/0221364 A1    Jul. 13, 2023

(30) Foreign Application Priority Data
Jan. 11, 2022 (KR) .................. 10-2022-0004296

(51) Int. Cl.
G01R 31/28 (2006.01)
(52) U.S. Cl.
CPC ................ *G01R 31/2843* (2013.01)
(58) Field of Classification Search
CPC ............ G01R 31/006; G01R 31/2843; G01R 19/1659; G01R 31/40; G11C 29/021; G11C 5/143
See application file for complete search history.

(56) References Cited

U.S. PATENT DOCUMENTS

| | | | |
|---|---|---|---|
| 6,498,523 B1 | 12/2002 | Gebara | |
| 7,624,303 B2 | 11/2009 | Burkland et al. | |
| 9,000,624 B2 | 4/2015 | Lee et al. | |
| 9,869,727 B2 | 1/2018 | Schweigert | |
| 10,419,041 B2 | 9/2019 | Muthali et al. | |
| 10,992,127 B2 | 4/2021 | Sonehara et al. | |
| 2018/0107257 A1* | 4/2018 | Ego ...................... | G06F 1/26 |
| 2020/0110883 A1 | 4/2020 | Cho | |
| 2020/0271722 A1 | 8/2020 | van Oevelen | |
| 2021/0172999 A1 | 6/2021 | Nam et al. | |

FOREIGN PATENT DOCUMENTS

| | | |
|---|---|---|
| CN | 105365712 A | 3/2016 |
| EP | 0537525 A2 | 9/1992 |
| KR | 10-0444799 B1 | 2/2006 |

OTHER PUBLICATIONS

Examination Report issued May 12, 2023 by the European Patent Office for EP Patent Application No. 23150856.5.

* cited by examiner

*Primary Examiner* — Jay Patidar
(74) *Attorney, Agent, or Firm* — Sughrue Mion, PLLC

(57) ABSTRACT

A device includes a function circuit that operates based on power provided by a first positive supply voltage and a first negative supply voltage, a monitoring circuit that operates based on power provided by a second positive supply voltage and a second negative supply voltage and that generates a first monitor signal based on monitoring an operation of the function circuit, and an output circuit that generates a second monitor signal based on monitoring the first positive supply voltage, generates a third monitor signal based on monitoring the second positive supply voltage, and generates an output signal that is output through one or more output pins, based on the first monitor signal, the second monitor signal, and the third monitor signal.

20 Claims, 23 Drawing Sheets

DEVICE AND METHOD FOR MONITORING FUNCTION CIRCUIT AND OUTPUTTING RESULT OF MONITORING

CROSS-REFERENCE TO RELATED APPLICATION

This application is based on and claims priority under 35 U.S.C. § 119 to Korean Patent Application No. 10-2022-0004296, filed on Jan. 11, 2022, in the Korean Intellectual Property Office, the disclosure of which is incorporated by reference herein in its entirety.

BACKGROUND

The present disclosure relates to monitoring, and more particularly, to a device and method for outputting a result of monitoring.

Monitoring circuits may be used to detect abnormal operations of electronic components. For example, because serious problems may be caused when abnormal operations occur in electronic components included in a vehicle, the use of a monitoring circuit for detecting the abnormal operations of the electronic components may be essential. An output of the monitoring circuit, namely, a result of monitoring, may be transmitted to an upper controller of a system, and the upper controller may identify an abnormal operation based on the result of the monitoring and may perform an appropriate operation corresponding to the identified abnormal operation. Therefore, it may be advantageous to accurately transmit the result of the monitoring to the upper controller.

SUMMARY

It is an aspect to provide a device and method for accurately outputting a result of monitoring.

According to an aspect of one or more embodiments, there is provided a device including a function circuit configured to operate based on power provided by a first positive supply voltage and a first negative supply voltage, a monitoring circuit configured to operate based on power provided by a second positive supply voltage and a second negative supply voltage and generate a first monitor signal based on monitoring an operation of the function circuit, and an output circuit configured to generate a second monitor signal based on monitoring the first positive supply voltage, generate a third monitor signal based on monitoring the second positive supply voltage, and generate an output signal that is output through at least one output pin of the device based on the first monitor signal, the second monitor signal, and the third monitor signal.

According to another aspect of one or more embodiments, there is provided a device comprising a function circuit configured to operate based on power provided by a first positive supply voltage and a first negative supply voltage; a monitoring circuit configured to operate based on power provided by a second positive supply voltage and a second negative supply voltage and generate a first monitor signal based on monitoring an operation of the function circuit; and an output circuit configured to generate a third positive supply voltage from one of the first positive supply voltage and the second positive supply voltage, and generate an output signal that is output from the device through at least one output pin, the output signal being generated from the first monitor signal based on power provided by the third positive supply voltage.

According to another aspect of one or more embodiments, there is provided a method comprising generating, by a monitoring circuit, a first monitor signal based on monitoring an operation of a function circuit; generating, by an output circuit, a second monitor signal based on monitoring a first positive supply voltage provided to the function circuit; generating, by the output circuit, a third monitor signal based on monitoring a second positive supply voltage provided to the monitoring circuit; and generating, by the output circuit, an output signal that is output through at least one output pin of the device, based on the first monitor signal, the second monitor signal, and the third monitor signal.

BRIEF DESCRIPTION OF THE DRAWINGS

Exemplary embodiments will be more clearly understood from the following detailed description taken in conjunction with the accompanying drawings, in which.

DETAILED DESCRIPTION

Figure 1:
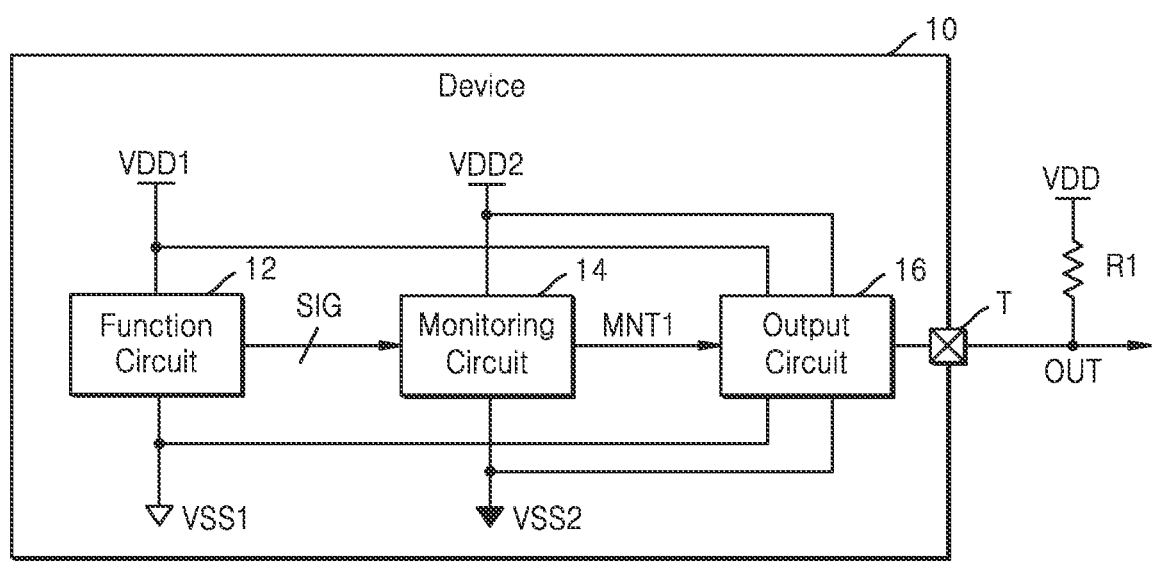
FIG. 1 is a block diagram of a device according to an example embodiment.

FIG. 1 is a block diagram of a device 10 according to an example embodiment. The device 10 may include a function circuit 12, a monitoring circuit 14, and an output circuit 16. The device 10 may be included in a system, and a function of the function circuit 12 included in the device 10 may be provided to the system. The system (for example, 170 of FIG. 17) may be independently used, like a mobile phone, or may be a component of an upper system such as an automobile. In some embodiments, the device 10 may be a semiconductor chip manufactured by a semiconductor process.

The function circuit 12 may perform at least one of functions provided by the device 10 or a function underlying the functions provided by the device 10. For example, the function circuit 12 may include an analog circuit such as a voltage generator, an analog filter, or an amplifier, may include a digital circuit processing a digital signal, such as a logic circuit, or may include a circuit that processes a mixed signal, such as an analog-to-digital converter or a digital-to-analog converter. As shown in FIG. 1, the function circuit 12 may operate based on power provided by a first positive supply voltage VDD1 and a first negative supply voltage VSS1.

The function circuit 12 may not properly perform a designed function, due to, for example, a defect occurring during the manufacture of the function circuit 12 or the device 10, degradation according to aging of the function circuit 12, or an external environment of the device 10. When the function circuit 12 does not properly operate, a malfunction and/or an error may be caused in the system including the device 10. For example, when the device 10 is included in a vehicle to provide a function necessary for driving (e.g., autonomous driving), errors in the function circuit 12 may cause serious problems. To cope with the errors of the function circuit 12, an international standard may be defined, and the device 10 may be designed to follow the international standard. For example, ISO26262, titled "Functional Safety Standard for Modern Road Vehicles", which is incorporated by reference herein in its entirety, is prescribed by the international standard organization (ISO), and may be referred to as road vehicles-functional safety. ISO26262 may define various requirements for the functional stability of an electrical and/or electronic (E/E) device mounted in a vehicle, and, for example, may prescribe mounting of a component for always monitoring the function circuit 12, namely, the monitoring circuit 14.

The monitoring circuit 14 may monitor operations of the function circuit 12. For example, as shown in FIG. 1, the monitoring circuit 14 may receive signals SIG from the function circuit 12, and may monitor the operations of the function circuit 12 based on the signals SIG. In some embodiments, the monitoring circuit 14 may include at least one sensor for sensing the signals SIG, for example, a temperature sensor, a voltage sensor, and a current sensor. The monitoring circuit 14 may generate a first monitor signal MNT1 by monitoring an operation of the function circuit 12, and the first monitor signal MNT1 may indicate whether the function circuit 12 normally operates. For example, when the function circuit 12 normally operates, the monitoring circuit 14 may generate an inactivated first monitor signal MNT1, and, when the function circuit does not normally operate, the monitoring circuit 14 may generate an activated first monitor signal MNT1. However, example embodiments are not limited to this and the monitor signal may be variously provided.

As shown in FIG. 1, the monitoring circuit 14 may operate based on power provided by a second positive supply voltage VDD2 and a second negative supply voltage VSS2. The second positive supply voltage VDD2 may be generated independently of the first positive supply voltage VDD1 provided to the function circuit 12, and the second negative supply voltage VSS2 may be generated independently of the first negative supply voltage VSS1 provided to the function circuit 12. Accordingly, even when a defect is generated in the first positive supply voltage VDD1 and/or the first negative supply voltage VSS1, the monitoring circuit 14 may normally monitor the operation of the function circuit 12. In some embodiments, at least one of the first positive supply voltage VDD1, the second positive supply voltage VDD2, the first negative supply voltage VSS1, and the second negative supply voltage VSS2 may be generated outside the device 10 and may be provided to the device 10. In some embodiments, at least one of the first positive supply voltage VDD1, the second positive supply voltage VDD2, the first negative supply voltage VSS1, and the second negative supply voltage VSS2 may be generated inside the device 10.

The output circuit 16 may receive the first monitor signal MNT1 from the monitoring circuit 14, and may generate an output signal OUT based on the first monitor signal MNT1. In some embodiments, the output signal OUT may be an open-drain (or open-collector) output. For example, as shown in FIG. 1, the output signal OUT may be output to the outside of the device 10 through an output pin T, and a pull-up resistor R1 may be connected to the output pin T. When an abnormal operation occurs in the function circuit 12, the output signal OUT may transit from a high level to a low level. In some embodiments, a positive supply voltage VDD applied to the pull-up resistor R1 may be the first positive supply voltage VDD1 or the second positive supply voltage VDD2. In some embodiments, the positive supply voltage VDD may be independent from the first positive supply voltage VDD1 and the second positive supply voltage VDD2.

As shown in FIG. 1, the output circuit 16 may receive the first positive supply voltage VDD1 and the second positive supply voltage VDD2. In some embodiments, the output circuit 16 may monitor the first positive supply voltage VDD1 and the second positive supply voltage VDD2, and may detect defects generated in the first positive supply voltage VDD1 and the second positive supply voltage VDD2. For example, the output circuit 16 may generate at least one monitor signal by monitoring the first positive supply voltage VDD1 and the second positive supply voltage VDD2, and may generate the output signal OUT based on not only the first monitor signal MNT1 received from the monitoring circuit 14 but also the at least one monitor signal. In some embodiments, the output circuit 16 may generate a third positive supply voltage VDD3 from the first positive supply voltage VDD1 and the second positive supply voltage VDD2 and the third positive supply voltage VDD3 may provide power to at least one circuit included in the output circuit 16, based on the at least one monitor signal.

As shown in FIG. 1, the output circuit 16 may receive the first negative supply voltage VSS1 and the second negative supply voltage VSS2. In some embodiments, the output circuit 16 may monitor the first negative supply voltage VSS1 and the second negative supply voltage VSS2, and may detect defects generated in the first negative supply voltage VSS1 and the second negative supply voltage VSS2. For example, the output circuit 16 may generate at least one monitor signal by monitoring the first negative supply voltage VSS1 and the second negative supply voltage VSS2, and may generate the output signal OUT based on not only the first monitor signal MNT1 received from the monitoring circuit 14 but also the at least one monitor signal. In some embodiments, the output circuit 16 may generate a third negative supply voltage VSS3 from the first negative supply voltage VSS1 and the second negative supply voltage VSS2 and the third negative supply voltage VSS3 and the third positive supply voltage VDD3 may provide power to at least one circuit included in the output circuit 16, based on the at least one monitor signal.

As described above, the output circuit 16 may monitor power sources, namely, the first positive supply voltage VDD1, the second positive supply voltage VDD2, the first negative supply voltage VSS1, and the second negative supply voltage VSS2, and may generate the output signal OUT including a result of the monitoring. The output circuit 16 may generate the third positive supply voltage VDD3 and/or the third negative supply voltage VSS3, and thus, even when defects occur in the power sources, may generate the output signal OUT accurately indicating the result of the monitoring. Accordingly, reliability of the device 10 may be improved, and a malfunction or error of the system including the device 10 may be effectively prevented. Examples of the output circuit 16 will now be described with reference to the drawings.

Figure 2A:
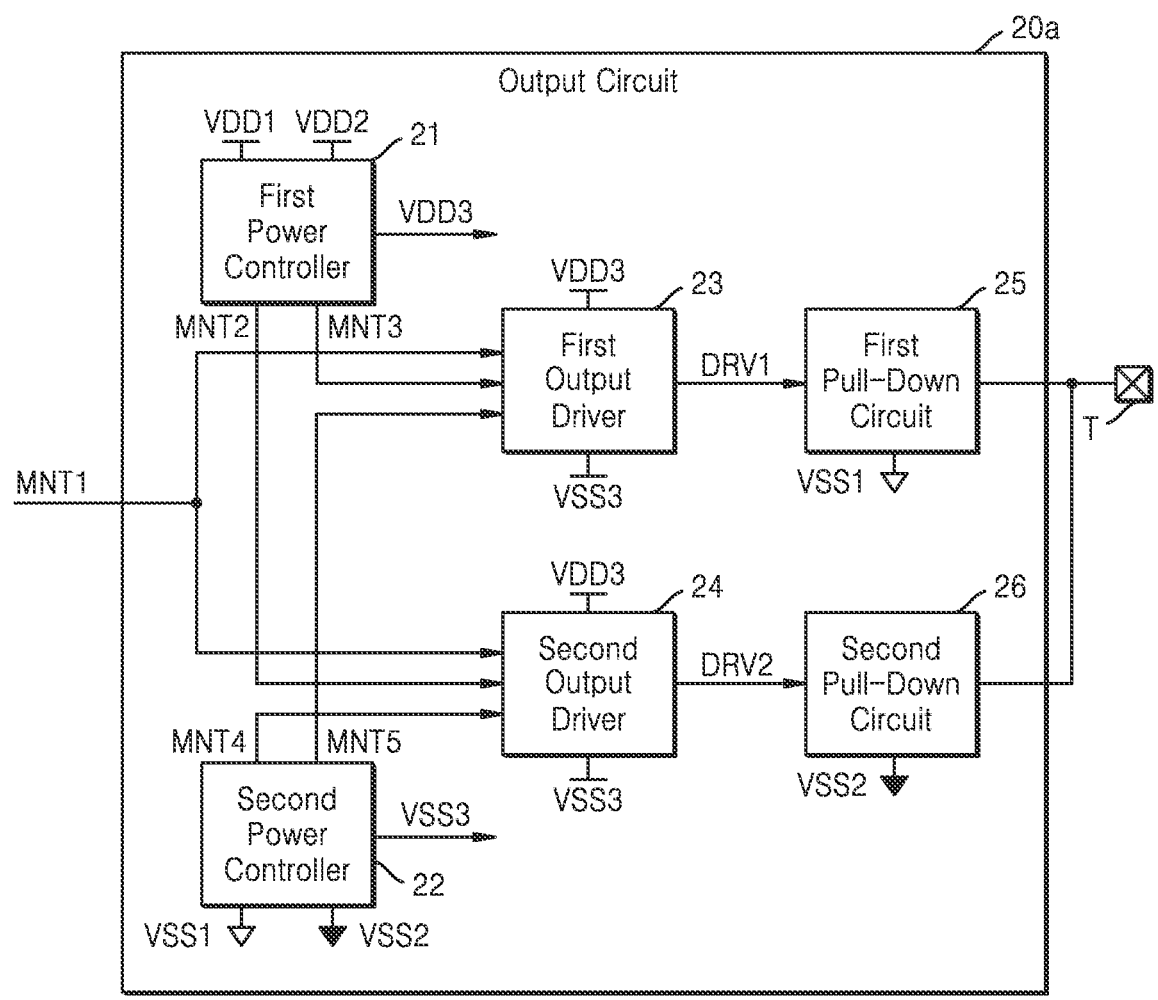
FIGS. 2A through 2C are block diagrams of output circuits according to example embodiments.
Figure 2B:
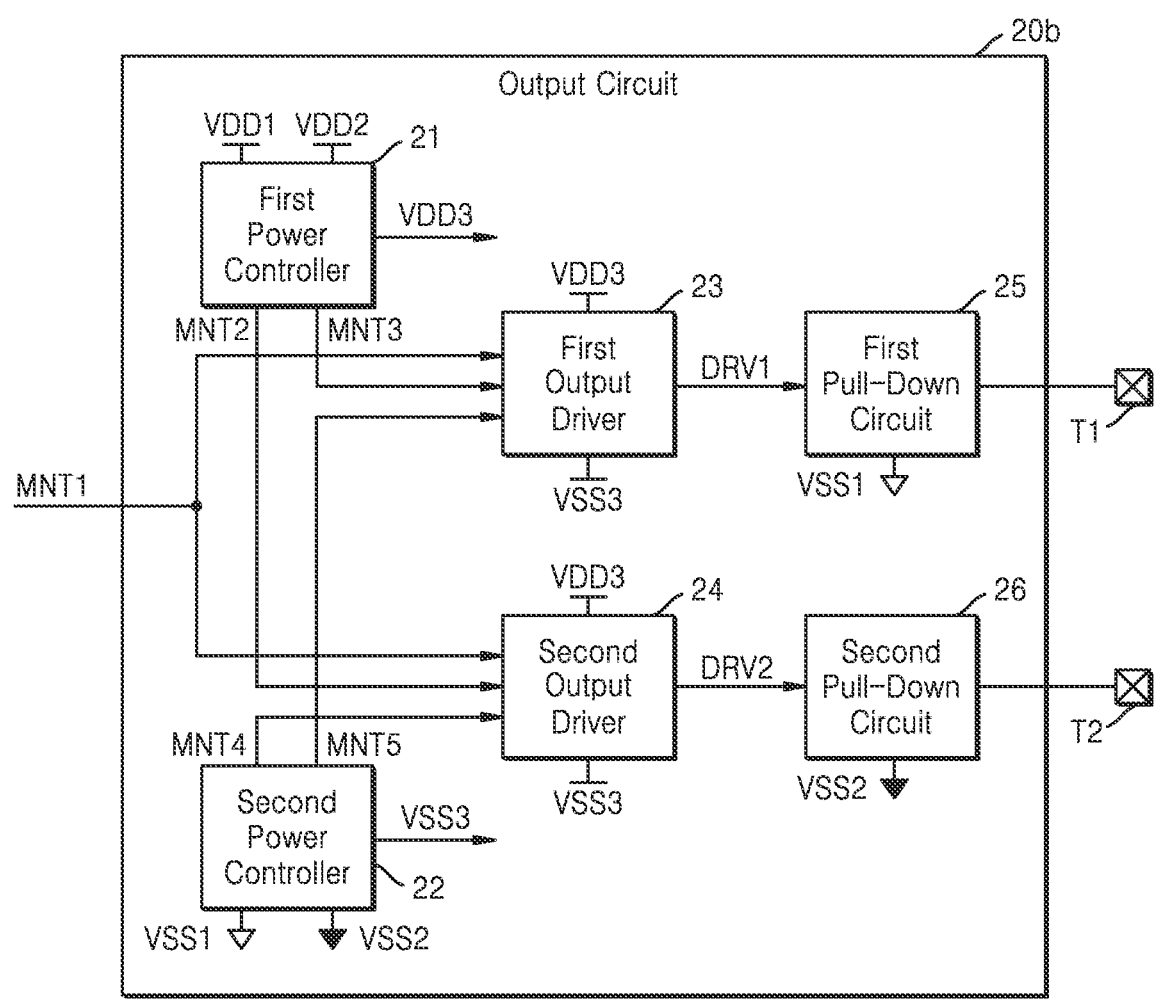
Figure 2C:
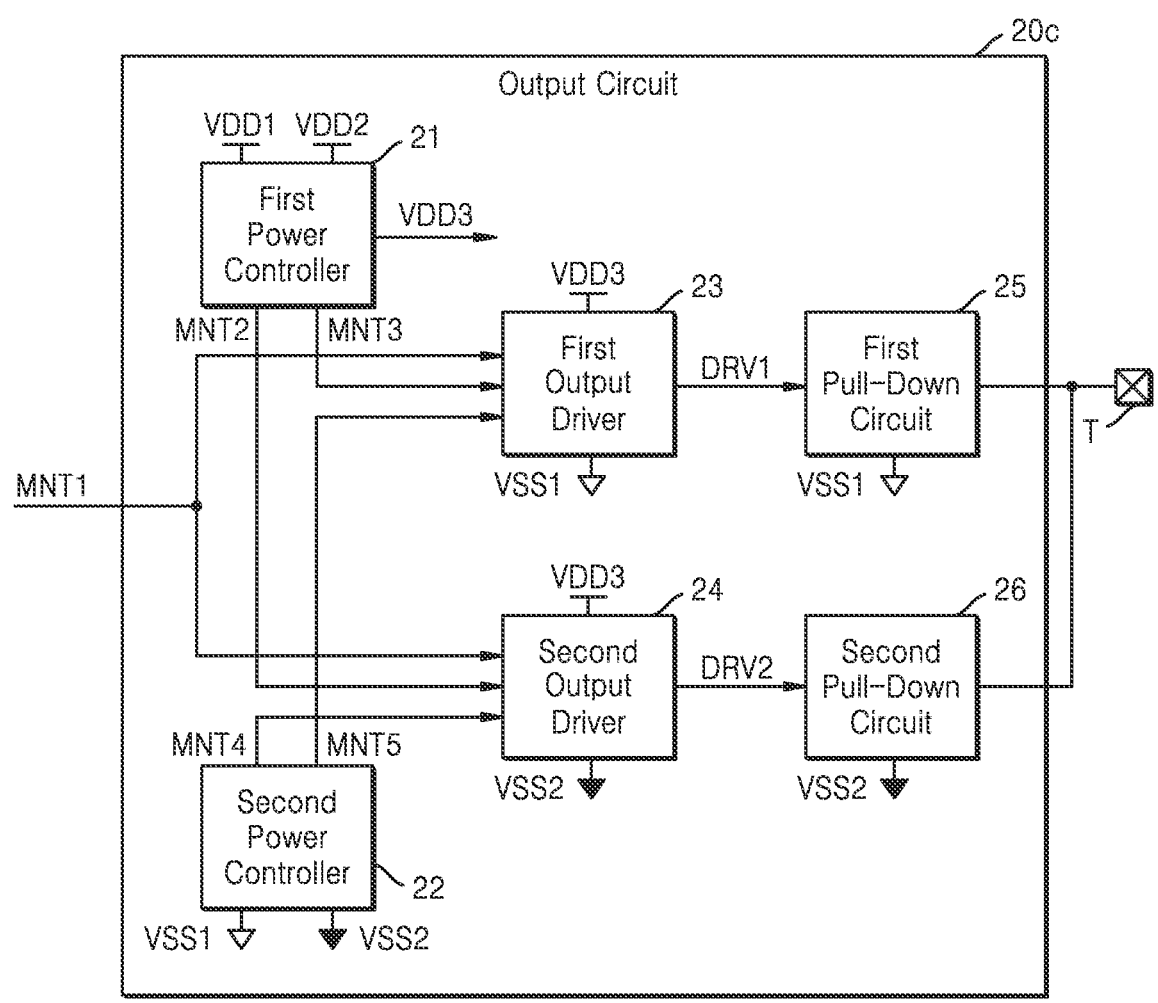

FIGS. 2A through 2C are block diagrams of output circuits according to example embodiments. Referring to FIGS. 2A through 2C, each of output circuits 20a, 20b, and 20c may include a first power controller 21, a second power controller 22, a first output driver 23, a second output driver 24, a first pull-down circuit 25, and a second pull-down circuit 26. Overlapping descriptions between FIGS. 2A through 2C will be omitted for conciseness.

Referring to FIG. 2A, the first power controller 21 may receive the first positive supply voltage VDD1 and the second positive supply voltage VDD2. The first power controller 21 may generate a second monitor signal MNT2 by monitoring the first positive supply voltage VDD1, and may generate a third monitor signal MNT3 by monitoring the second positive supply voltage VDD2. For example, when a defect (for example, a voltage drop) occurs in the first positive supply voltage VDD1, the first power controller 21 may generate an activated second monitor signal MNT2, and, when a defect (for example, a voltage drop) occurs in the second positive supply voltage VDD2, the first power controller 21 may generate an activated third monitor signal MNT3.

The first power controller 21 may generate the third positive supply voltage VDD3 from the first positive supply voltage VDD1 and the second positive supply voltage VDD2. For example, the first power controller 21 may select one of the first positive supply voltage VDD1 and the second positive supply voltage VDD2 and may generate the third positive supply voltage VDD3 from the selected voltage, based on the second monitor signal MNT2 and/or the third monitor signal MNT3. Thus, as will described later with reference to FIGS. 9A and 9B, the third positive supply voltage VDD3 may maintain a level even when a defect occurs in one of the first positive supply voltage VDD1 and the second positive supply voltage VDD2. An illustration of the first power controller 21 will be described later with reference to FIG. 3.

The second power controller 22 may receive the first negative supply voltage VSS1 and the second negative supply voltage VSS2. The second power controller 22 may generate a fourth monitor signal MNT4 by monitoring the first negative supply voltage VSS1, and may generate a fifth monitor signal MNT5 by monitoring the second negative supply voltage VSS2. For example, when a defect (for example, a voltage rise) occurs in the first negative supply voltage VSS1, the second power controller 22 may generate an activated fourth monitor signal MNT4, and, when a defect (for example, a voltage rise) occurs in the second negative supply voltage VSS2, the second power controller 22 may generate an activated fifth monitor signal MNT5. Herein, the first through fifth monitor signals MNT1 through MNT5 are assumed to be active-high signals, and thus each of the first through fifth monitor signals MNT1 through MNT5 may have a high level during activation. However, example embodiments are not limited to this and, in some embodiments, the first through fifth monitor signals MNT1 through MNT5 may be active-low signals.

The second power controller 22 may generate the third negative supply voltage VSS3 from the first negative supply voltage VSS1 and the second negative supply voltage VSS2. For example, the second power controller 22 may select one of the first negative supply voltage VSS1 and the second negative supply voltage VSS2 and may generate the third negative supply voltage VSS3 from the selected voltage, based on the fourth monitor signal MNT4 and/or the fifth monitor signal MNT5. Thus, as will described later with reference to FIGS. 10A and 10B, the third negative supply voltage VSS3 may maintain a level even when a defect occurs in one of the first negative supply voltage VSS1 and the second negative supply voltage VSS2. An illustration of the second power controller 22 will be described later with reference to FIG. 4A.

The first output driver 23 may receive the first monitor signal MNT1, the third monitor signal MNT3, and the fifth monitor signal MNT5, and may generate a first driving signal DRV1. For example, when at least one of the first monitor signal MNT1, the third monitor signal MNT3, and the fifth monitor signal MNT5 is activated, the first output driver 23 may generate an activated first driving signal DRV1. Thus, when an abnormal operation occurs in the function circuit 12 of FIG. 1 or a defect occurs in the second positive supply voltage VDD2 and/or the second negative supply voltage VSS2, the first driving signal DRV1 may be activated. As shown in FIG. 2A, the first output driver 23 may operate based on power provided by the third positive supply voltage VDD3 and the third negative supply voltage VSS3. Thus, the first output driver 23 may accurately generate the first driving signal DRV1 despite a defect occurred in the power sources. An illustration of the first output driver 23 will be described later with reference to FIGS. 5A and 5B.

The second output driver 24 may receive the first monitor signal MNT1, the second monitor signal MNT2, and the fourth monitor signal MNT4, and may generate a second driving signal DRV2. For example, when at least one of the first monitor signal MNT1, the second monitor signal MNT2, and the fourth monitor signal MNT4 is activated, the second output driver 24 may generate an activated second driving signal DRV2. Thus, when an abnormal operation occurs in the function circuit 12 of FIG. 1 or a defect occurs in the first positive supply voltage VDD1 and/or the first negative supply voltage VSS1, the second driving signal DRV2 may be activated. As shown in FIG. 2A, the second output driver 24 may operate based on power provided by the third positive supply voltage VDD3 and the third negative supply voltage VSS3. Thus, the second output driver 24 may accurately generate the second driving signal DRV2 despite a defect occurring in the power sources. An illustration of the second output driver 24 will be described later with reference to FIGS. 5A and 5B.

The first pull-down circuit 25 may receive the first driving signal DRV1 from the first output driver 23, and may pull-down the output pin T to the first negative supply voltage VSS1 based on the first driving signal DRV1. For example, the first pull-down circuit 25 may float the output pin T from the first negative supply voltage VSS1 in response to an inactivated first driving signal DRV1, and may provide the first negative supply voltage VSS1 to the output pin T in response to the activated first driving signal DRV1. An illustration of the first pull-down circuit 25 will be described later with reference to FIGS. 5A and 5B.

The second pull-down circuit 26 may receive the second driving signal DRV2 from the second output driver 24, and may pull-down the output pin T to the second negative supply voltage VSS2 based on the second driving signal DRV2. For example, the second pull-down circuit 26 may float the output pin T from the second negative supply voltage VSS2 in response to an inactivated second driving signal DRV2, and may provide the second negative supply voltage VSS2 to the output pin T in response to the activated second driving signal DRV2. An illustration of the second pull-down circuit 26 will be described later with reference to FIGS. 5A and 5B.

Referring to FIG. 2B, the output circuit 20b may be connected to a first output pin T1 and a second output pin T2. In contrast with the first pull-down circuit 25 and the second pull-down circuit 26 of FIG. 2A commonly connected to the output pin T within a device, the first pull-down circuit 25 and the second pull-down circuit 26 of FIG. 2B may be connected to the first output pin T1 and the second output pin T2, respectively. In some embodiments, a device including the output circuit 20b, the first output pin T1 and the second output pin T2 of FIG. 2B may be mounted on a printed circuit board (PCB), and the first output pin T1 and the second output pin T2 may be electrically connected to each other by a pattern included in the PCB. An example in which the first pull-down circuit 25 and the second pull-down circuit 26 are connected to one output pin T as shown in FIG. 2A will now be mainly described. However, embodiments are not limited thereto.

Referring to FIG. 2C, in contrast with the output circuits 20a and 20b of FIGS. 2A and 2B, the third negative supply voltage VSS3 may be omitted from the output circuit 20c. For example, as shown in FIG. 2C, the second power controller 22 of FIG. 2C may generate the fourth monitor signal MNT4 by monitoring the first negative supply voltage VSS1 and may generate the fifth monitor signal MNT5 by monitoring the second negative supply voltage VSS2, but, in contrast with the second power controllers of FIGS. 2A and 2B, may not generate the third negative supply voltage VSS3. Thus, in the output circuits 20a and 20b of FIGS. 2A and 2B, as shown in FIG. 2C, the first output driver 23 and the second output driver 24 receiving the third negative supply voltage VSS3 may receive the first negative supply voltage VSS1 and the second negative supply voltage VSS2, respectively. An illustration of the second power controller 22 of FIG. 2C will be described later with reference to FIG. 4B.

Figure 3:
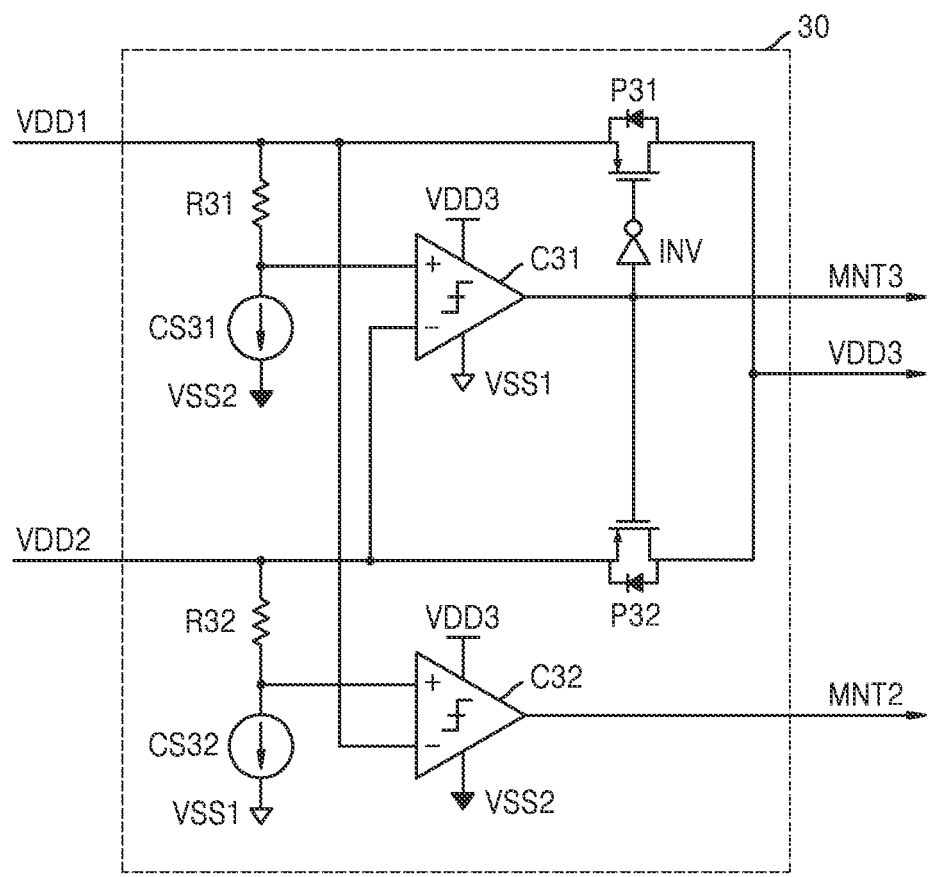
FIG. 3 is a circuit diagram of a first power controller according to an example embodiment.

FIG. 3 is a circuit diagram of a first power controller 30 according to an example embodiment. As described above with reference to FIGS. 2A through 2C, the first power controller 30 may receive the first positive supply voltage VDD1 and the second positive supply voltage VDD2, and may output the third monitor signal MNT3, the fourth monitor signal MNT4, and the third positive supply voltage VDD3. As shown in FIG. 3, the first power controller 30 may include a first current source CS31, a second current source CS32, a first resistor R31, a second resistor R32, a first comparator C31, a second comparator C32, an inverter INV, a first transistor P31, and a second transistor P32.

Referring to FIG. 3, the first current source CS31 may drain a constant current from the first positive supply voltage VDD1 through the first resistor R31. Thus, a non-inverting input of the first comparator C31 may have a voltage that is lower than the first positive supply voltage VDD1. The second positive supply voltage VDD2 may be applied to an inverting input of the first comparator C31, and the first comparator C31 may generate the third monitor signal MNT3 by comparing the voltage that is lower than the first positive supply voltage VDD1 with the second positive supply voltage VDD2. For example, when the second positive supply voltage VDD2 has a similar level to a level of the first positive supply voltage VDD1, namely, when no defects occur in the second positive supply voltage VDD2, the first comparator C31 may generate an inactivated third monitor signal MNT3. On the other hand, when a defect (for example, a voltage drop) occurs in the second positive supply voltage VDD2, the first comparator C31 may generate the activated third monitor signal MNT3.

The second current source CS32 may drain a constant current from the second positive supply voltage VDD2 through the second resistor R32. Thus, a non-inverting input of the second comparator C32 may have a voltage that is lower than the second positive supply voltage VDD2. The first positive supply voltage VDD1 may be applied to an inverting input of the second comparator C32, and the second comparator C32 may generate the second monitor signal MNT2 by comparing the voltage that is lower than the second positive supply voltage VDD2 with the first positive supply voltage VDD1. For example, when the first positive supply voltage VDD1 has a similar level to a level of the second positive supply voltage VDD2, namely, when no defects occur in the first positive supply voltage VDD1, the second comparator C32 may generate an inactivated second monitor signal MNT2. On the other hand, when a defect (for example, a voltage drop) occurs in the first positive supply voltage VDD1, the second comparator C32 may generate the activated second monitor signal MNT2.

The first transistor P31 may receive a signal obtained by the inverter INV inverting the third monitor signal MNT3, and the second transistor P32 may receive the third monitor signal MNT3. For example, when no defects occur in the first positive supply voltage VDD1 and the second positive supply voltage VDD2, each of the second monitor signal MNT2 and the third monitor signal MNT3 may have a low level. As shown in FIG. 3, each of the first transistor P31 and the second transistor P32 may be a p-type field effect transistor (PFET), and, due to the turned-on second transistor P32 and the turned-off first transistor P31, the third positive supply voltage VDD3 may correspond to the second positive supply voltage VDD2. Meanwhile, when a defect occurs in the second positive supply voltage VDD2 and thus the third monitor signal MNT3 is activated, namely, transits to a high level, the third positive supply voltage VDD3 may correspond to the first positive supply voltage VDD1 due to the turned-on first transistor P31 and the turned-off second transistor P32. It may be understood that each of the first transistor P31 and the second transistor P32 of FIG. 3 may be replaced by another device that is capable of operating as a switch. That is, example embodiments are not limited to the first and second transistors P31 and P32.

In some embodiments, in contrast with FIG. 3, the first comparator C31 may receive the third negative supply voltage VSS3 generated by the second power controller 22 of FIG. 2A instead of the first negative supply voltage VSS1, and the second comparator C32 may receive the third negative supply voltage VSS3 instead of the second negative supply voltage VSS2. In some embodiments, in contrast with FIG. 3, the first current source CS31 may provide a current to the first negative supply voltage VSS1 or the third negative supply voltage VSS3 instead of the second negative supply voltage VSS2, and the second current source CS32 may provide a current to the second negative supply voltage VSS2 or the third negative supply voltage VSS3 instead of the first negative supply voltage VSS1.

Figure 4A:
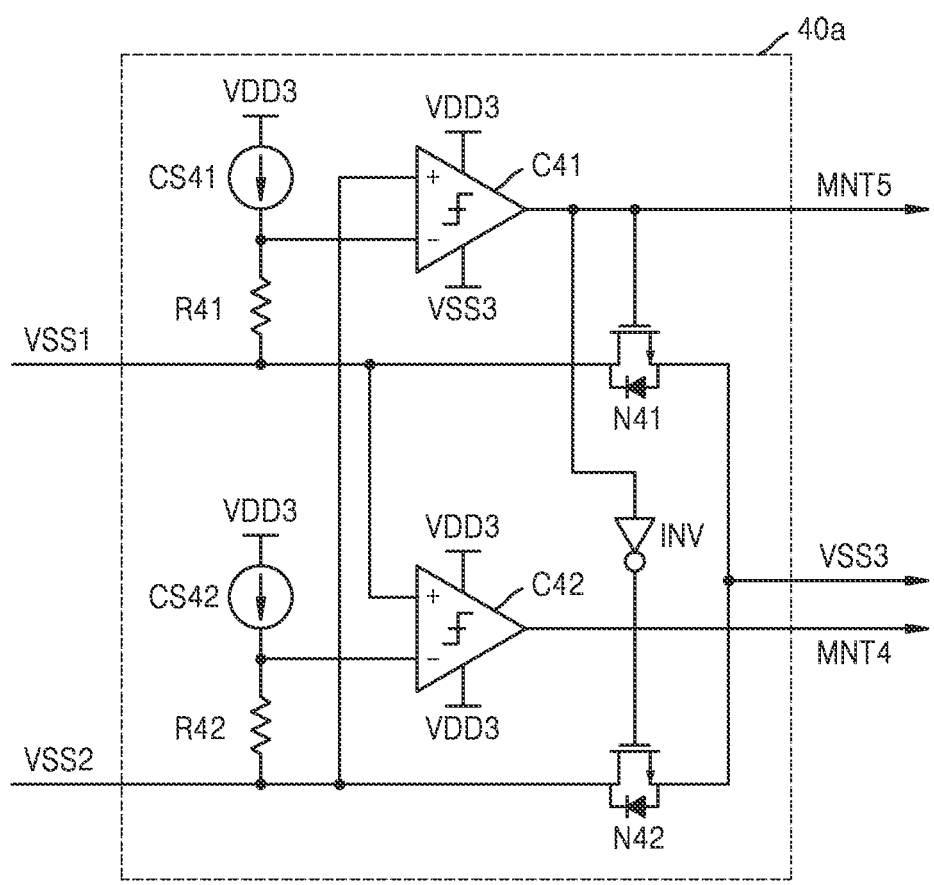
FIGS. 4A and 4B are circuit diagrams of second power controllers according to example embodiments.
Figure 4B:
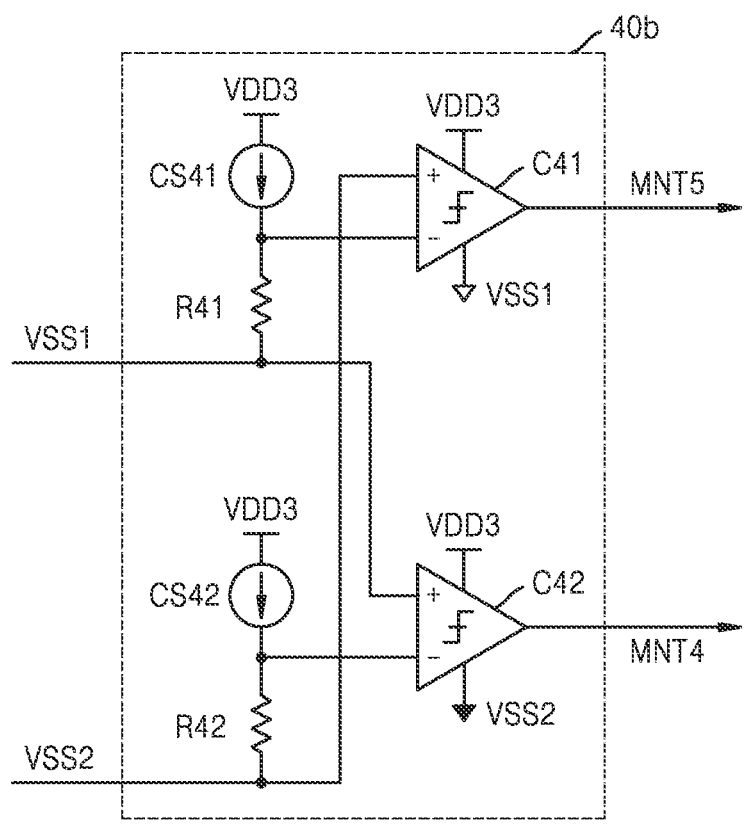

FIGS. 4A and 4B are circuit diagrams of second power controllers according to example embodiments. In detail, the circuit diagram of FIG. 4A illustrates the second power controllers 22 of FIGS. 2A and 2B, and the circuit diagram of FIG. 4B illustrates the second power controller 22 of FIG. 2C. Overlapping descriptions between FIGS. 4A and 4B will be omitted for conciseness.

Referring to FIG. 4A, as described above with reference to FIGS. 2A, a second power controller 40a may receive the first negative supply voltage VSS1 and the second negative supply voltage VSS2, and may output the fourth monitor signal MNT4, the fifth monitor signal MNT5, and the third negative supply voltage VSS3. As shown in FIG. 4A, the second power controller 40a may include a first current source CS41, a second current source CS42, a first resistor R41, a second resistor R42, a first comparator C41, a second comparator C42, an inverter INV, a first transistor N41, and a second transistor N42.

Referring to FIG. 4A, the first current source CS41 may drain a constant current from the first negative supply voltage VSS1 through the first resistor R41. Thus, an inverting input of the first comparator C41 may have a voltage that is higher than the first negative supply voltage VSS1. The second negative supply voltage VSS2 may be applied to a non-inverting input of the first comparator C41, and the first comparator C41 may generate the fifth monitor signal MNT5 by comparing the voltage that is higher than the first negative supply voltage VSS1 with the second negative supply voltage VSS2. For example, when the second negative supply voltage VSS2 has a similar level to a level of the first negative supply voltage VSS1, namely, when no defects occur in the second negative supply voltage VSS2, the first comparator C41 may generate an inactivated fifth monitor signal MNT5. On the other hand, when a defect (for example, a voltage rise) occurs in the second negative supply voltage VSS2, the first comparator C41 may generate the activated fifth monitor signal MNT5.

The second current source CS42 may drain a constant current from the second negative supply voltage VSS2 through the second resistor R42. Thus, an inverting input of the second comparator C42 may have a voltage that is higher than the second negative supply voltage VSS2. The first negative supply voltage VSS1 may be applied to a non-inverting input of the second comparator C42, and the second comparator C42 may generate the fourth monitor signal MNT4 by comparing the voltage that is higher than the second negative supply voltage VSS2 with the first negative supply voltage VSS1. For example, when the first negative supply voltage VSS1 has a similar level to a level of the second negative supply voltage VSS2, namely, when no defects occur in the first negative supply voltage VSS1, the second comparator C42 may generate an inactivated fourth monitor signal MNT4. On the other hand, when a defect (for example, a voltage rise) occurs in the first negative supply voltage VSS1, the second comparator C42 may generate the activated fourth monitor signal MNT4.

The first transistor N41 may receive the fifth monitor signal MNT5, and the second transistor N42 may receive a signal obtained by the inverter INV inverting the fifth monitor signal MNT5. For example, when no defects occur in the first negative supply voltage VSS1 and the second negative supply voltage VSS2, each of the fourth monitor signal MNT4 and the fifth monitor signal MNT5 may have a low level. As shown in FIG. 4A, each of the first transistor N41 and the second transistor N42 may be an n-type field effect transistor (NFET), and, due to the turned-on second transistor N42 and the turned-off first transistor N41, the third negative supply voltage VSS3 may correspond to the second negative supply voltage VSS2. Meanwhile, when a defect occurs in the second negative supply voltage VSS2 and thus the fifth monitor signal MNT5 is activated, namely, transits to a high level, the third negative supply voltage VSS3 may correspond to the first negative supply voltage VSS1 due to the turned-on first transistor N41 and the turned-off second transistor N42. It may be understood that each of the first transistor N41 and the second transistor N42 of FIG. 4A may be replaced by another device that is capable of operating as a switch. That is, example embodiments are not limited to the first and second transistors N41 and N42.

As shown in FIG. 4A, the first comparator C41 and the second comparator C42 may operate based on power provided by the third positive supply voltage VDD3 and the third negative supply voltage VSS3. Thus, despite a defect occurred in the power sources, the first comparator C41 and the second comparator C42 may normally operate, and the fourth monitor signal MNT4 and the fifth monitor signal MNT5 may be accurately output.

Figure 5A:
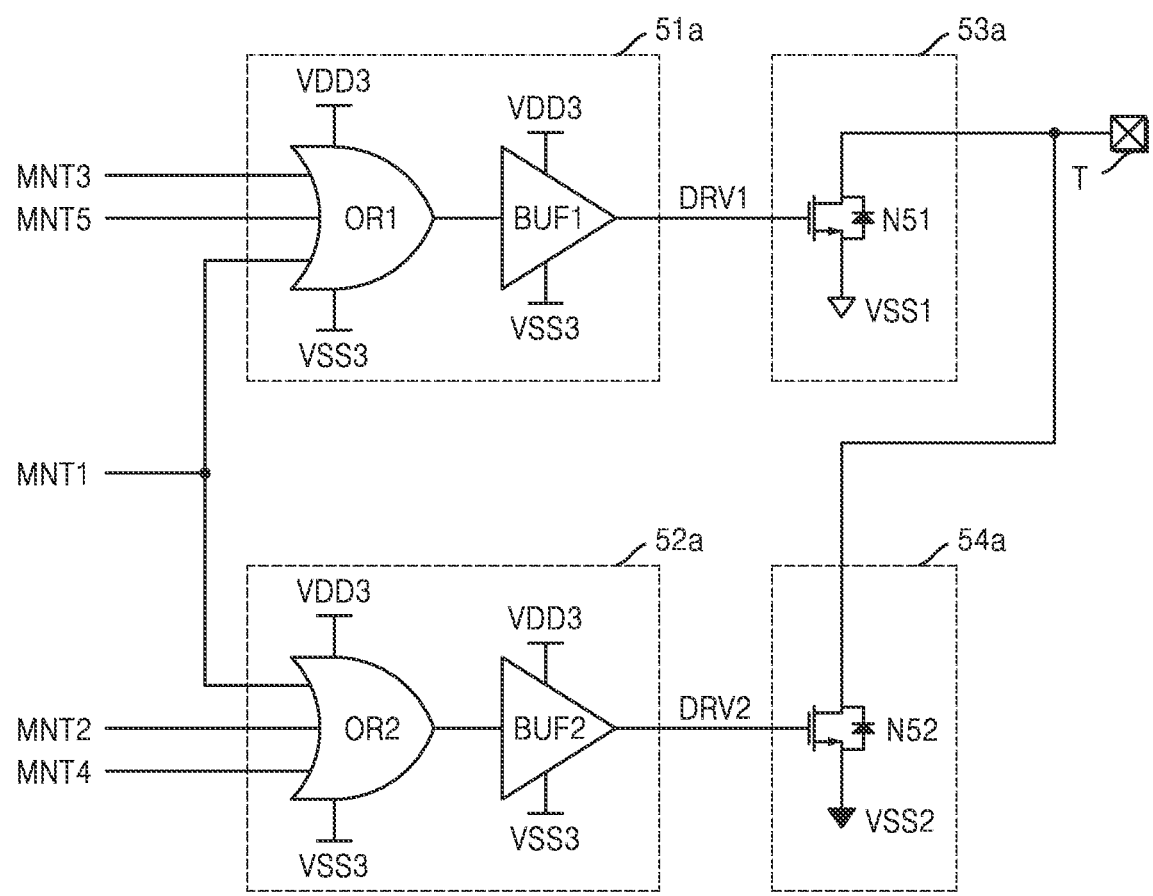
FIGS. 5A and 5B are circuit diagrams of output drivers and pull-down circuits, according to example embodiments.
Figure 5B:
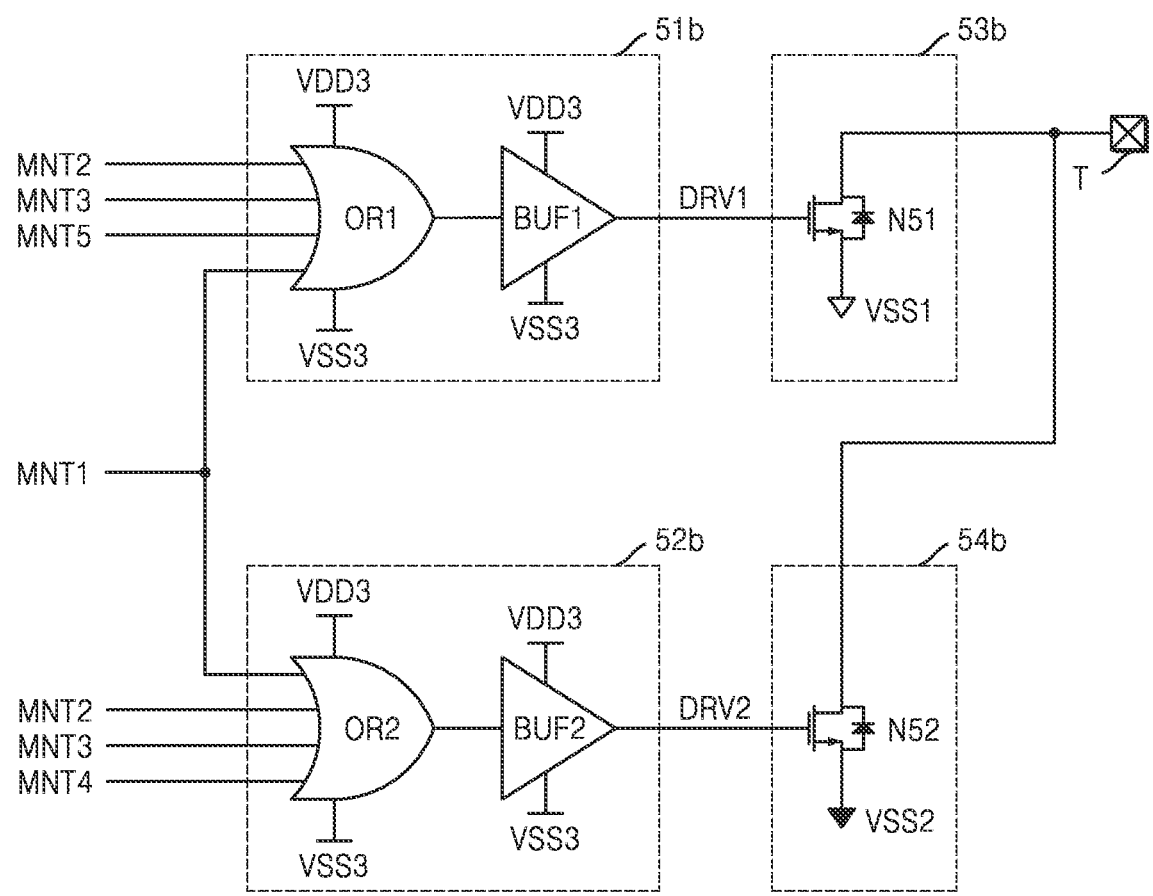

Referring to FIG. 4B, the second power controller 40b may not generate the third negative supply voltage VSS3. In other words, the second power controller 40b of FIG. 4A may include, similar to the second power controller 40a of FIG. 4A, the first current source CS41, the second current source CS42, the first resistor R41, the second resistor R42, the first comparator C41, and the second comparator C42, but the inverter INV, the first transistor N41, and the second transistor N42 of FIG. 4A may be omitted from the second power controller 40b of FIG. 4B. Thus, as shown in FIG. 4B, the first comparator C41 may receive the first negative supply voltage VSS1 instead of the third negative supply voltage VSS3, and the second comparator C42 may receive the second negative supply voltage VSS2 instead of the third negative supply voltage VSS3. FIGS. 5A and 5B are circuit diagrams of output drivers and pull-down circuits according to example embodiments. Overlapping descriptions between FIGS. 5A and 5B will be omitted for conciseness.

Referring to FIG. 5A, a first output driver 51a may include a first OR gate OR1 and a first buffer BUF1. The first OR gate OR1 may receive the first monitor signal MNT1, the third monitor signal MNT3, and the fifth monitor signal MNT5, and the first buffer BUF1 may generate the first driving signal DRV1 from an output of the first OR gate OR1. Thus, when an abnormal operation occurs in the function circuit 12 of FIG. 1 or a defect occurs in the second positive supply voltage VDD2 and/or the second negative supply voltage VSS2, the first driving signal DRV1 may be activated, namely, may have a high level.

A first pull-down circuit 53a may include a first transistor N51, and may pull-down the output pin T based on the first driving signal DRV1. For example, the first transistor N51 may be turned off in response to the inactivated first driving signal DRV1, and may float the output pin T from the first negative supply voltage VSS1. The first transistor N51 may be turned on in response to the activated first driving signal DRV1, and may apply the first negative supply voltage VSS1 to the output pin T.

A second output driver 52a may include a second OR gate OR2 and a second buffer BUF2. The second OR gate OR2 may receive the first monitor signal MNT1, the second monitor signal MNT2, and the fourth monitor signal MNT4, and the second buffer BUF2 may generate the second driving signal DRV2 from an output of the second OR gate OR2. Thus, when an abnormal operation occurs in the function circuit 12 of FIG. 1 or a defect occurs in the first positive supply voltage VDD1 and/or the first negative supply voltage VSS1, the second driving signal DRV2 may be activated, namely, may have a high level.

A second pull-down circuit 54a may include a second transistor N52, and may pull-down the output pin T based on the second driving signal DRV2. For example, the second transistor N52 may be turned off in response to the inactivated second driving signal DRV2, and may float the output pin T from the second negative supply voltage VSS2. The second transistor N52 may be turned on in response to the activated second driving signal DRV2, and may apply the second negative supply voltage VSS2 to the output pin T.

As shown in FIG. 5A, the first output driver 51a and the second output driver 52a may operate based on power provided by the third positive supply voltage VDD3 and the third negative supply voltage VSS3. Thus, despite a defect occurring in the power sources, the first output driver 51a and the second output driver 52a may normally operate, and the first driving signal DRV1 and the second driving signal DRV2 may be accurately output. In some embodiments, as described above with reference to FIGS. 2C and 4B, when the third negative supply voltage VSS3 is omitted, the first output driver 51a may receive the first negative supply voltage VSS1 instead of the third negative supply voltage VSS3, and the second output driver 52a may receive the second negative supply voltage VSS2 instead of the third negative supply voltage VSS3.

Referring to FIG. 5B, a first output driver 51b may include the first OR gate OR1 and the first buffer BUF1, and a second output driver 52b may include the second OR gate OR2 and the second buffer BUF2. A first pull-down circuit 53b may include the first transistor N51, and the second pull-down circuit 54b may include the second transistor N52.

Compared with the illustration of FIG. 5A, the first OR gate OR1 of FIG. 5B may further receive the second monitor signal MNT2, and the second OR gate OR2 of FIG. 5B may further receive the third monitor signal MNT3. Thus, when an abnormal operation occurs in the function circuit 12 of FIG. 1 or a defect occurs in the first positive supply voltage VDD1, the second positive supply voltage VDD2, and/or the second negative supply voltage VSS2, the first driving signal DRV1 may be activated, namely, may have a high level. When an abnormal operation occurs in the function circuit 12 of FIG. 1 or a defect occurs in the first positive supply voltage VDD1, the second positive supply voltage VDD2, and/or the first negative supply voltage VSS1, the second driving signal DRV2 may be activated, namely, may have a high level. In some embodiments, as described above with reference to FIGS. 2C and 4B, when the third negative supply voltage VSS3 is omitted, the second output driver 51b may receive the first negative supply voltage VSS1 instead of the third negative supply voltage VSS3, and the second output driver 52b may receive the second negative supply voltage VSS2 instead of the third negative supply voltage VSS3.

Figure 6:
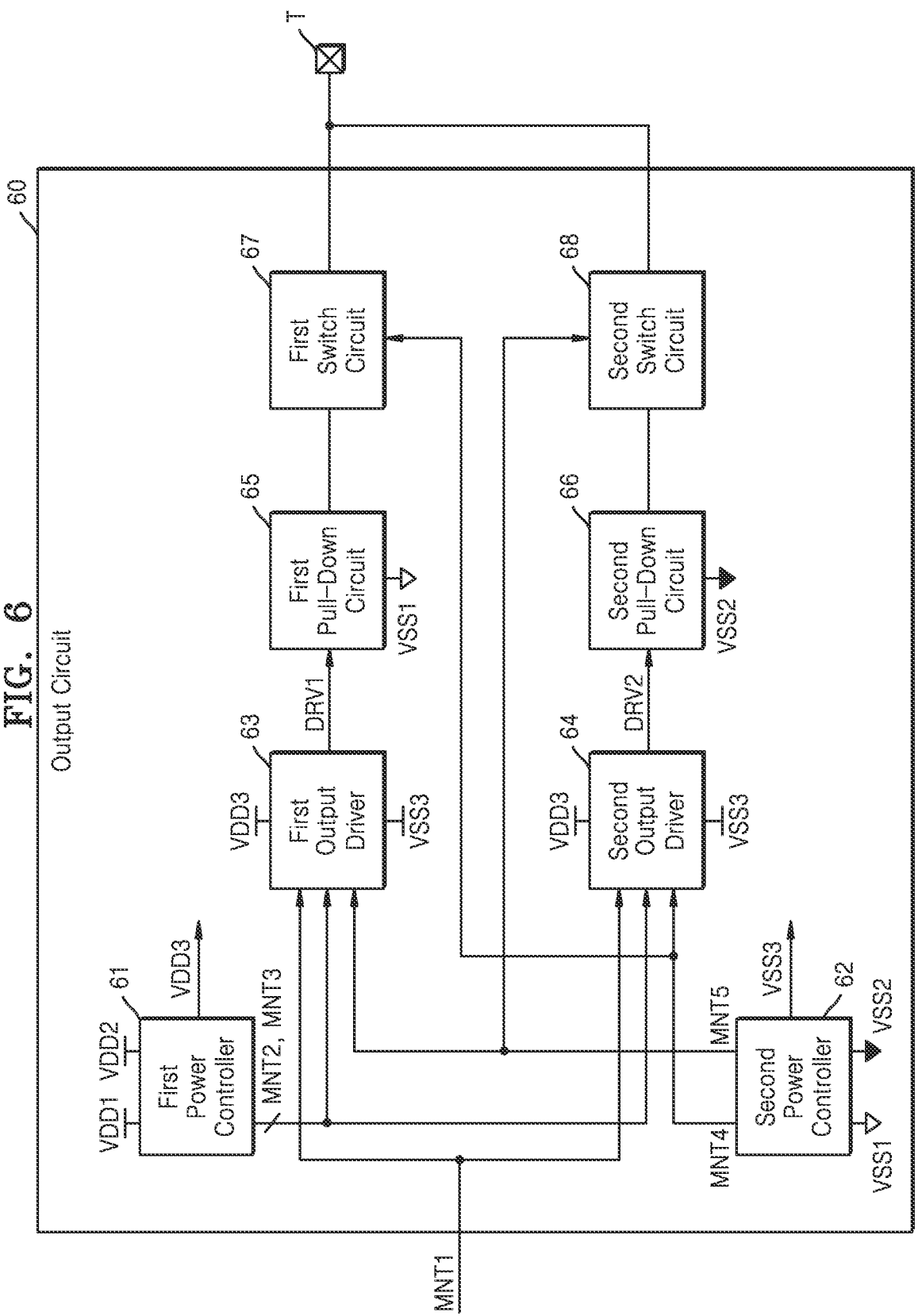
FIG. 6 is a block diagram of an output circuit according to an example embodiment.

FIG. 6 is a block diagram of an output circuit 60 according to an example embodiment. As shown in FIG. 6, the output circuit 60 may include a first power controller 61, a second power controller 62, a first output driver 63, a second output driver 64, a first pull-down circuit 65, a second pull-down circuit 66, a first switch circuit 67, and a second switch circuit 68. Descriptions of FIG. 6 that are the same as given above with reference to FIGS. 2A through 2C will be omitted for conciseness.

Referring to FIG. 6, compared with the output circuits 20a, 20b, and 20c of FIGS. 2A through 2C, the output circuit 60 of FIG. 6 may further include the first switch circuit 67 and the second switch circuit 68. As described above with reference to FIG. 5B, each of the first output driver 63 and the second output driver 64 may receive the second monitor signal MNT2 and the third monitor signal MNT3. In some embodiments, as described above with reference to FIGS. 2A, 2B, 2C, and 5A, the first output driver 63 may not receive the second monitor signal MNT2, and the second output driver 64 may not receive the third monitor signal MNT3.

The first switch circuit 67 may be connected between the first pull-down circuit 65 and the output pin T, and may receive the fourth monitor signal MNT4. The first switch circuit 67 may electrically connect or disconnect the first pull-down circuit 65 to or from the output pin T based on the fourth monitor signal MNT4. For example, when the fourth monitor signal MNT4 is activated, namely, a defect occurs in the first negative supply voltage VSS1, the first switch circuit 67 may electrically disconnect the first pull-down circuit 65 from the output pin T. Accordingly, error and damage to the first pull-down circuit 65 may be prevented from occurring due to an increase in the first negative supply voltage VSS1. An illustration of the first switch circuit 67 will be described later with reference to FIG. 7.

The second switch circuit 68 may be connected between the second pull-down circuit 66 and the output pin T, and may receive the fifth monitor signal MNT5. The second switch circuit 68 may electrically connect or disconnect the second pull-down circuit 66 to or from the output pin T based on the fifth monitor signal MNT5. For example, when the fifth monitor signal MNT5 is activated, namely, a defect occurs in the second negative supply voltage VSS2, the second switch circuit 68 may electrically disconnect the second pull-down circuit 66 from the output pin T. Accordingly, error and damage to the second pull-down circuit 66 may be prevented from occurring due to an increase in the second negative supply voltage VSS2. An illustration of the second switch circuit 68 will be described later with reference to FIG. 7.

Figure 7:
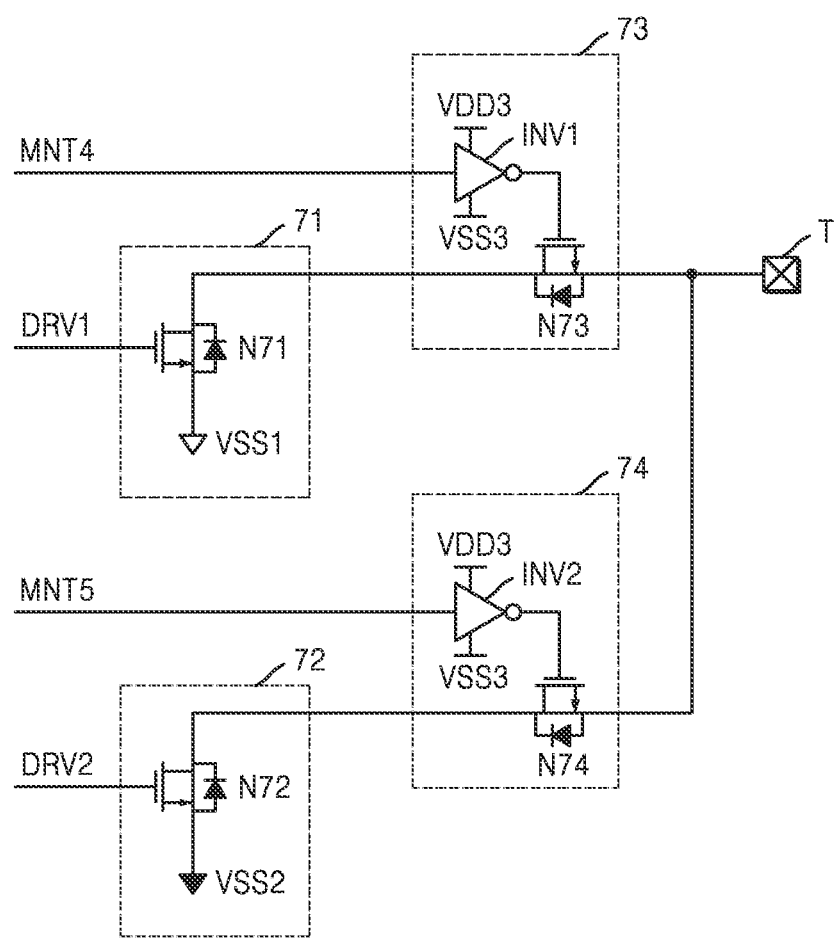
FIG. 7 is a circuit diagram of a pull-down circuit and a switch circuit, according to an example embodiment.

FIG. 7 is a circuit diagram of a pull-down circuit and a switch circuit according to an example embodiment. As described above with reference to FIGS. 5A and 5B, a first pull-down circuit 71 may include a first transistor N71 receiving the first driving signal DRV1, and the second pull-down circuit 72 may include a second transistor N72 receiving the second driving signal DRV2.

A first switch circuit 73 may include a first inverter INV1 and a third transistor N73. The first inverter INV1 may receive the fourth monitor signal MNT4, and may provide an inverted signal of the fourth monitor signal MNT4 to the third transistor N73. Accordingly, when a defect occurs in the first negative supply voltage VSS1, namely, when the fourth monitor signal MNT4 is activated, the third transistor N73 may be turned off. When the first negative supply voltage VSS1 rises and approximately reaches the first positive supply voltage VDD1 or the second positive supply voltage VDD2, a reverse current may be generated through a body diode of the first transistor N71. Thus, a magnitude of the output signal OUT output through the output pin T may correspond to a difference between the first negative supply voltage VSS1 and a built-in voltage of the body diode, and, consequently, the output pin T may not be normally pulled down. In addition, the first transistor N71 may be damaged due to the reverse current. However, as described above, when a defect occurs in the first negative supply voltage VSS1, namely, when the fourth monitor signal MNT4 is activated, the first switch circuit 73 may electrically disconnect the first pull-down circuit 71 from the output pin T, and accordingly error caused by the first transistor N71 or damage to the first transistor N71 may be prevented. The output pin T may be pulled down due to the second driving signal DRV2 activated by the activated fourth monitor signal MNT4, and the output signal OUT may indicate a defect of the first negative supply voltage VSS1.

A second switch circuit 74 may include a second inverter INV2 and a fourth transistor N74. The second inverter INV2 may receive the fifth monitor signal MNT5, and may provide an inverted signal of the fifth monitor signal MNT5 to the fourth transistor N74. Accordingly, when a defect occurs in the second negative supply voltage VSS2, namely, when the fifth monitor signal MNT5 is activated, the fourth transistor N74 may be turned off. When the second negative supply voltage VSS2 rises and approximately reaches the first positive supply voltage VDD1 or the second positive supply voltage VDD2, a reverse current may be generated through a body diode of the second transistor N72. Thus, a magnitude of the output signal OUT output through the output pin T may correspond to a difference between the second negative supply voltage VSS2 and the built-in voltage of the body diode, and, consequently, the output pin T may not be normally pulled down. The second transistor N72 may be damaged due to the reverse current. However, as described above, when a defect occurs in the second negative supply voltage VSS2, namely, when the fifth monitor signal MNT5 is activated, the second switch circuit 74 may electrically disconnect the second pull-down circuit 72 from the output pin T, and accordingly error caused by the second transistor N72 or damage to the second transistor N72 may be prevented. The output pin T may be pulled down due to the first driving signal DRV1 activated by the activated fifth monitor signal MNT5, and the output signal OUT may indicate a defect of the second negative supply voltage VSS2.

Figure 8:
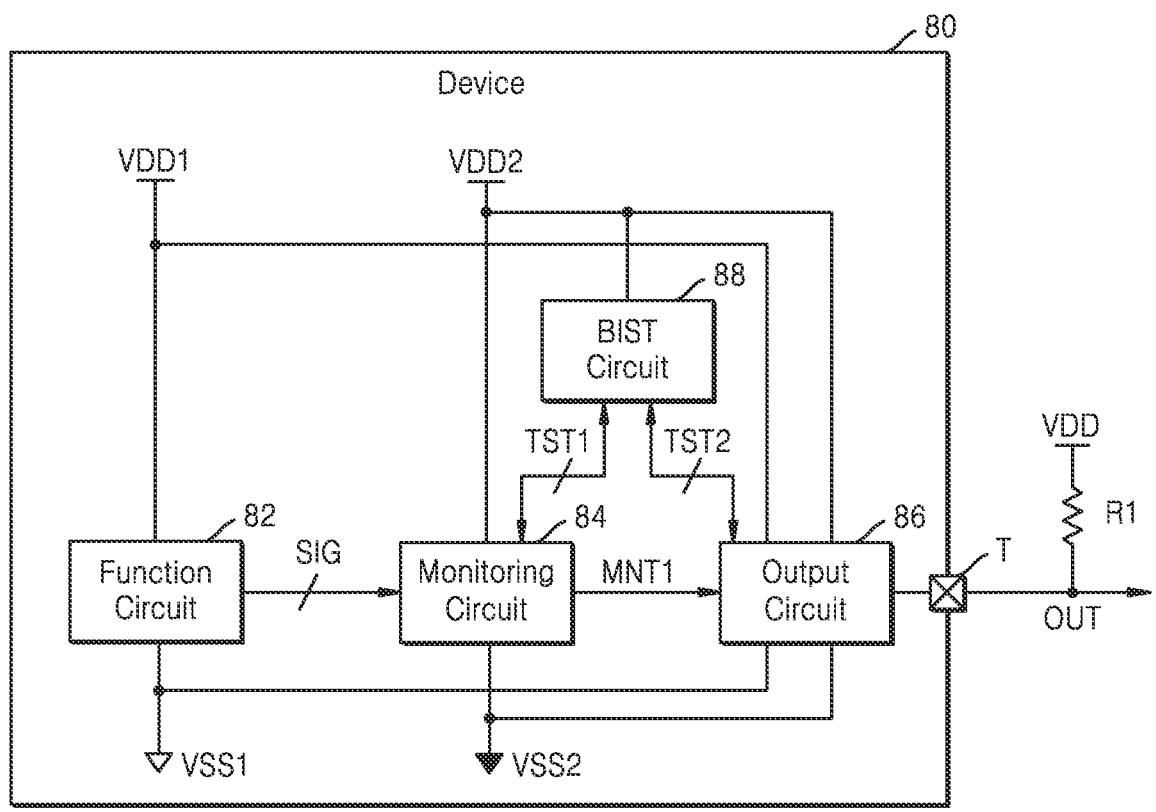
FIG. 8 is a block diagram of a device according to an example embodiment.

FIG. 8 is a block diagram of a device 80 according to an example embodiment. As illustrated in FIG. 8, the device 80 may include a function circuit 82, a monitoring circuit 84, an output circuit 86, and a built-in self-test (BIST) circuit 88. Compared with the device 10 of FIG. 1, the device 80 of FIG. 8 may further include the BIST circuit 88. Descriptions of FIG. 8 that are the same as given above with reference to FIG. 1 will be omitted for conciseness.

The international standard such as ISO26262 may prescribe essential inclusion of the BIST circuit 88 as not only the monitoring circuit 84 for monitoring the function circuit 82 but also an additional component for detecting whether the monitoring circuit 84 normally operates. For example, when the monitoring circuit 84 does not normally operate, an abnormal operation of the function circuit 82 may not be detected, or, despite a normal operation of the function circuit 82, the first monitor signal MNT1 indicating an abnormal operation of the function circuit 82 may be generated. To address this problem, the BIST circuit 88 may test the monitoring circuit 84 in a test mode, and may ensure that the monitoring circuit 84 normally monitors the function circuit 82. As shown in FIG. 8, the BIST circuit 88 may transmit and/or receive a first test signal TST1 to and/or from the monitoring circuit 84, and may test the monitoring circuit 84 through the first test signal TST1. For example, the BIST circuit 88 may provide a test input to the monitoring circuit 84 in the test mode, and may test the monitoring circuit 84 by detecting signals output by the monitoring circuit 84 in response to the test input.

As described above with reference to the drawings, the output circuit 86 may monitor power supply voltages, and may generate at least one monitor signal. For example, as shown in FIG. 8, the output circuit 86 may receive the first positive supply voltage VDD1 and the second positive supply voltage VDD2, and may detect defects of the first positive supply voltage VDD1 and the second positive supply voltage VDD2. The output circuit 86 may receive the first negative supply voltage VSS1 and the second negative supply voltage VSS2, and may detect defects of the first negative supply voltage VSS1 and the second negative supply voltage VSS2. Similar to the monitoring circuit 84, a monitoring function of the output circuit 86 may be tested. To this end, the BIST circuit 88 may test the output circuit 86 through a second test signal TST2. For example, the first power controller 61 and the second power controller 62 of FIG. 6 may be tested by the BIST circuit 88 in the test mode.

Figure 9A:
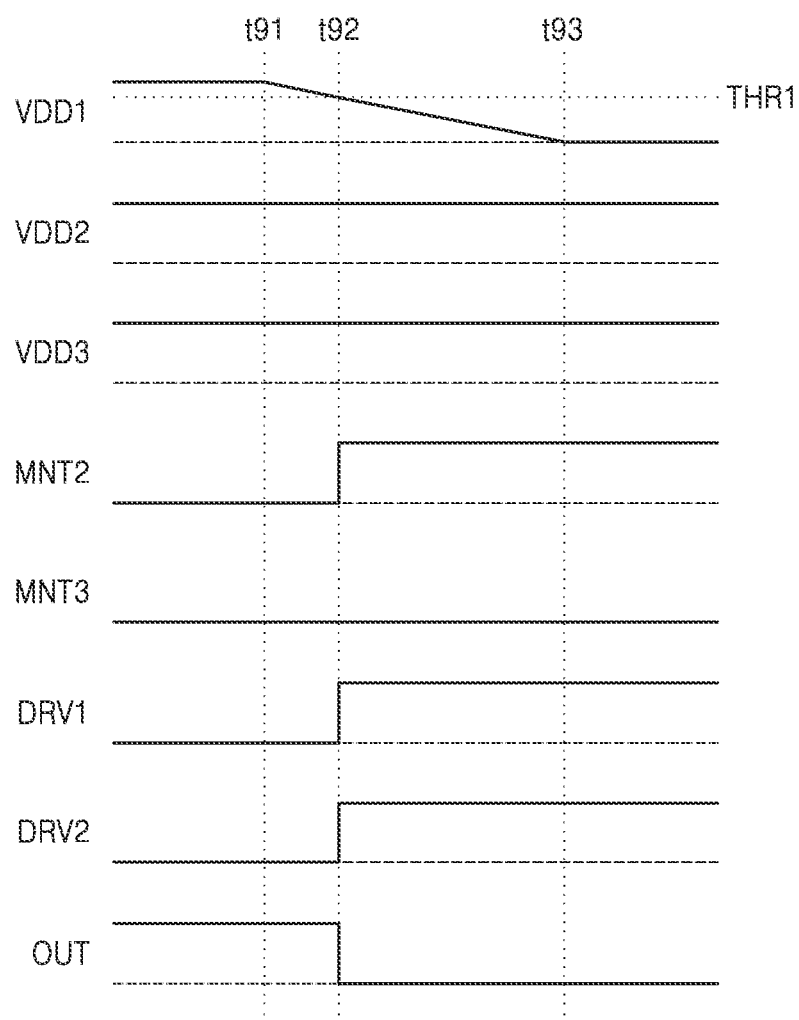
FIGS. 9A and 9B are timing diagrams of operations of output circuits according to example embodiments.
Figure 9B:
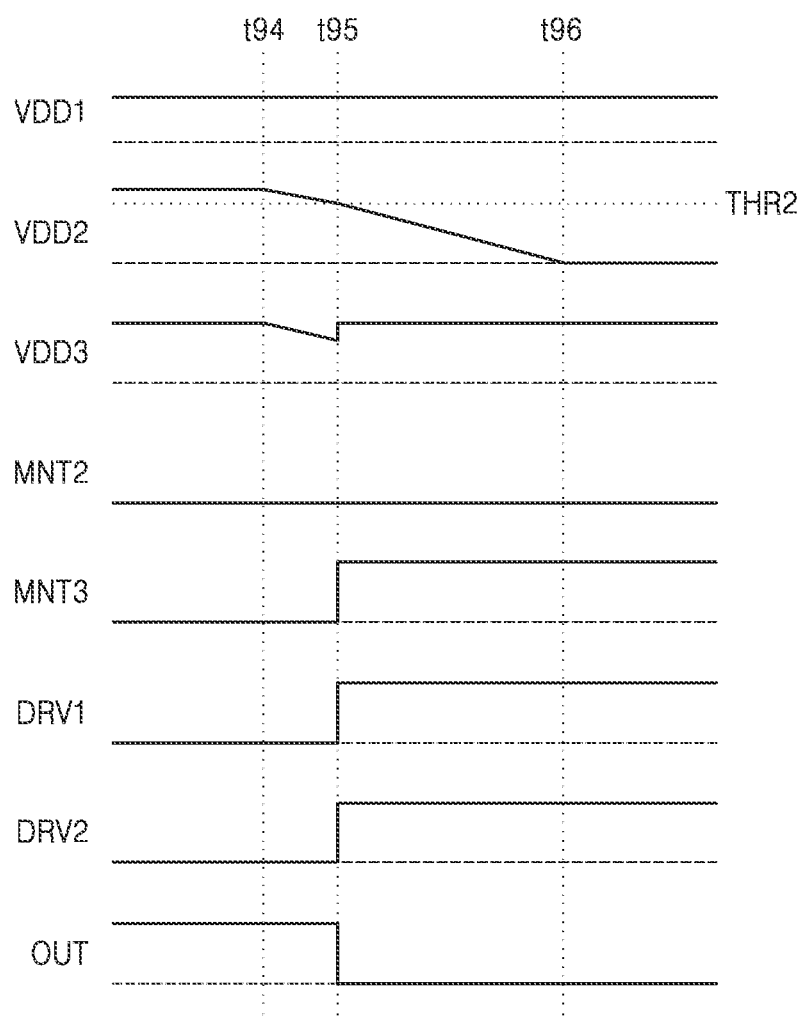

FIGS. 9A and 9B are timing diagrams of operations of output circuits according to example embodiments. In detail, the timing diagram of FIG. 9A illustrates an operation of the output circuit when a defect occurs in the first positive supply voltage VDD1, and FIG. 9B illustrates an operation of the output circuit when a defect occurs in the second positive supply voltage VDD2. In FIGS. 9A and 9B, the second monitor signal MNT2, the third monitor signal MNT3, the first driving signal DRV1, and the second driving signal DRV2 are assumed to be active-high signals, and the output signal OUT is assumed to be an active-low signal. FIGS. 9A and 9B will now be described with reference to FIG. 6.

Referring to FIG. 9A, at time t91, the first positive supply voltage VDD1 may start to fall. For example, when a defect occurs in a circuit providing the first positive supply voltage VDD1 or a defect occurs in a pattern transmitting the first positive supply voltage VDD1, the first positive supply voltage VDD1 may decrease. Because the first positive supply voltage VDD1 is normally provided until time t91, the second monitor signal MNT2 may be inactivated, the first driving signal DRV1 and the second driving signal DRV2 may also be inactivated, and the output signal OUT may also be inactivated.

At time t92, the second monitor signal MNT2 may be activated. For example, the first positive supply voltage VDD1 may intersect a first threshold value THR1, and the first power controller 61 may generate the activated second monitor signal MNT2. In some embodiments, as described above with reference to FIG. 3, the first threshold value THR1 may correspond to a voltage that is lower than the second positive supply voltage VDD2. The first output driver 63 may generate the activated first driving signal DRV1 in response to the activated second monitor signal MNT2, and the second output driver 64 may also generate the activated second driving signal DRV2 in response to the activated second monitor signal MNT2. The first pull-down circuit 65 and the second pull-down circuit 66 may pull down the output pin T in response to the activated first driving signal DRV1 and the activated second driving signal DRV2, respectively, and thus the output signal OUT may be activated. The first power controller 61 may output the third positive supply voltage VDD3 from the second positive supply voltage VDD2 in response to the activated second monitor signal MNT2 and/or the inactivated third monitor signal MNT3.

At time t93, the first positive supply voltage VDD1 may approximately reach a negative supply voltage. For example, the first positive supply voltage VDD1 may reach the first negative supply voltage VSS1 or the second negative supply voltage VSS2. As shown in FIG. 9A, even when the first positive supply voltage VDD1 decreases down to the negative supply voltage, the second monitor signal MNT2, the first driving signal DRV1, and the second driving signal DRV2 may maintain an activation state, and the output signal OUT may also maintain an activation state.

Referring to FIG. 9B, at time t94, the second positive supply voltage VDD2 may start to fall. For example, when a defect occurs in a circuit providing the second positive supply voltage VDD2 or a defect occurs in a pattern transmitting the second positive supply voltage VDD2, the second positive supply voltage VDD2 may decrease. Because the second positive supply voltage VDD2 is normally provided until time t94, the third monitor signal MNT3 may be inactivated, the first driving signal DRV1 and the second driving signal DRV2 may also be inactivated, and the output signal OUT may also be inactivated.

At time t95, the third monitor signal MNT3 may be activated. For example, the second positive supply voltage VDD2 may intersect a second threshold value THR2, and the first power controller 61 may generate the activated third monitor signal MNT3. In some embodiments, as described above with reference to FIG. 3, the second threshold value THR2 may correspond to a voltage that is lower than the first positive supply voltage VDD1. The first output driver 63 may generate the activated first driving signal DRV1 in response to the activated third monitor signal MNT3, and the second output driver 64 may also generate the activated second driving signal DRV2 in response to the activated third monitor signal MNT3. The first pull-down circuit 65 and the second pull-down circuit 66 may pull down the output pin T in response to the activated first driving signal DRV1 and the activated second driving signal DRV2, respectively, and thus the output signal OUT may be activated. The first power controller 61 may output the third positive supply voltage VDD3 from the first positive supply voltage VDD1 instead of the second positive supply voltage VDD2 in response to the inactivated second monitor signal MNT2 and/or the activated third monitor signal MNT3.

At time t96, the second positive supply voltage VDD2 may approximately reach a negative supply voltage. For example, the second positive supply voltage VDD2 may reach the first negative supply voltage VSS1 or the second negative supply voltage VSS2. As shown in FIG. 9B, even when the second positive supply voltage VDD2 decreases down to the negative supply voltage, the third monitor signal MNT3, the first driving signal DRV1, and the second driving signal DRV2 may maintain an activation state, and the output signal OUT may also maintain an activation state.

Figure 10A:
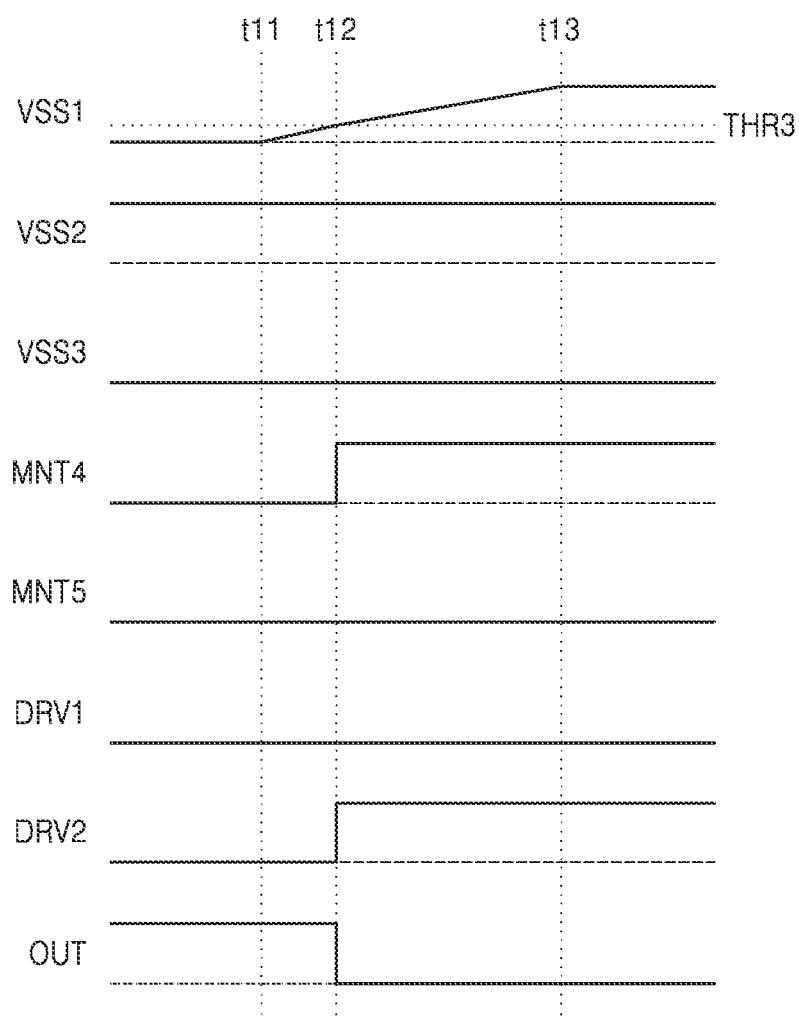
FIGS. 10A and 10B are timing diagrams of operations of output circuits according to example embodiments.
Figure 10B:
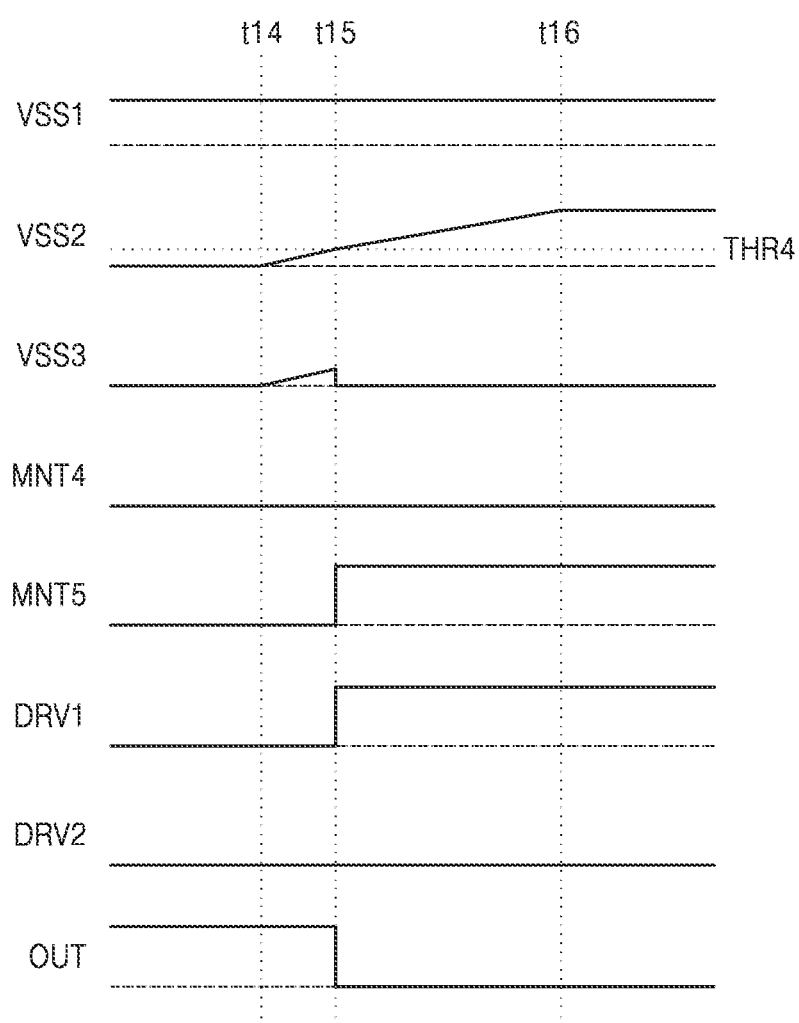

FIGS. 10A and 10B are timing diagrams of operations of output circuits according to example embodiments. In detail, the timing diagram of FIG. 10A illustrates an operation of the output circuit when a defect occurs in the first negative supply voltage VSS1, and FIG. 10B illustrates an operation of the output circuit when a defect occurs in the second negative supply voltage VSS2. In FIGS. 10A and 10B, the second monitor signal MNT2, the third monitor signal MNT3, the first driving signal DRV1, and the second driving signal DRV2 are assumed to be active-high signals, and the output signal OUT is assumed to be an active-low signal. FIGS. 10A and 10B will now be described with reference to FIG. 6.

Referring to FIG. 10A, at time t11, the first negative supply voltage VSS1 may start to rise. For example, when a defect occurs in a circuit providing the first negative supply voltage VSS1 or a defect occurs in a pattern transmitting the first negative supply voltage VSS1, the first negative supply voltage VSS1 may increase. Because the first negative supply voltage VSS1 is normally provided until time t11, the fourth monitor signal MNT4 may be inactivated, the first driving signal DRV1 and the second driving signal DRV2 may also be inactivated, and the output signal OUT may also be inactivated.

At time t12, the fourth monitor signal MNT4 may be activated. For example, the first negative supply voltage VSS1 may intersect a third threshold value THR3, and the second power controller 62 may generate the activated fourth monitor signal MNT4. In some embodiments, as described above with reference to FIGS. 4A and 4B, the third threshold value THR3 may correspond to a voltage that is higher than the second negative supply voltage VSS2. The second output driver 64 may generate the activated second driving signal DRV2 in response to the activated fourth monitor signal MNT4. The second switch circuit 68 may electrically connect the second pull-down circuit 66 to the output pin T in response to the inactivated fifth monitor signal MNT5, whereas the first switch circuit 67 may electrically disconnect the first pull-down circuit 65 from the output pin T in response to the activated fourth monitor signal MNT4. Accordingly, the second pull-down circuit 66 may pull down the output pin T in response to the activated second driving signal DRV2, and the output signal OUT may be activated. The second power controller 62 may output the third negative supply voltage VSS3 from the second negative supply voltage VSS2 in response to the activated fourth monitor signal MNT4 and/or the inactivated fifth monitor signal MNT5.

At time t13, the first negative supply voltage VSS1 may approximately reach a positive supply voltage. For example, the first negative supply voltage VSS1 may reach the first positive supply voltage VDD1 or the second positive supply voltage VDD2. As shown in FIG. 10A, even when the first negative supply voltage VSS1 increases up to the positive supply voltage, the fourth monitor signal MNT4 and the second driving signal DRV2 may maintain an activation state, and the output signal OUT may also maintain an activation state.

Referring to FIG. 10B, at time t14, the second negative supply voltage VSS2 may start to rise. For example, when a defect occurs in a circuit providing the second negative supply voltage VSS2 or a defect occurs in a pattern transmitting the second negative supply voltage VSS2, the second negative supply voltage VSS2 may increase. Because the second negative supply voltage VSS2 is normally provided until time t14, the fifth monitor signal MNT5 may be inactivated, the first driving signal DRV1 and the second driving signal DRV2 may also be inactivated, and the output signal OUT may also be inactivated.

At time t15, the fifth monitor signal MNT5 may be activated. For example, the second negative supply voltage VSS2 may intersect a fourth threshold value THR4, and the second power controller 62 may generate the activated fifth monitor signal MNT5. In some embodiments, as described above with reference to FIGS. 4A and 4B, the fourth threshold value THR4 may correspond to a voltage that is higher than the first negative supply voltage VSS1. The first output driver 63 may generate the activated first driving signal DRV1 in response to the activated fifth monitor signal MNT5. The first switch circuit 67 may electrically connect the first pull-down circuit 65 to the output pin T in response to the inactivated fourth monitor signal MNT4, whereas the second switch circuit 68 may electrically disconnect the second pull-down circuit 66 from the output pin T in response to the activated fifth monitor signal MNT5. Accordingly, the first pull-down circuit 65 may pull down the output pin T in response to the activated first driving signal DRV1, and the output signal OUT may be activated. The second power controller 62 may output the third negative supply voltage VSS3 from the first negative supply voltage VSS1 instead of the second negative supply voltage VSS2 in response to the inactivated fourth monitor signal MNT4 and/or the activated fifth monitor signal MNT5.

At time t16, the second negative supply voltage VSS2 may approximately reach a positive supply voltage. For example, the second negative supply voltage VSS2 may reach the first positive supply voltage VDD1 or the second positive supply voltage VDD2. As shown in FIG. 10B, even when the second negative supply voltage VSS2 increases up to the positive supply voltage, the fifth monitor signal MNT5 and the first driving signal DRV1 may maintain an activation state, and the output signal OUT may also maintain an activation state.

Figure 11:
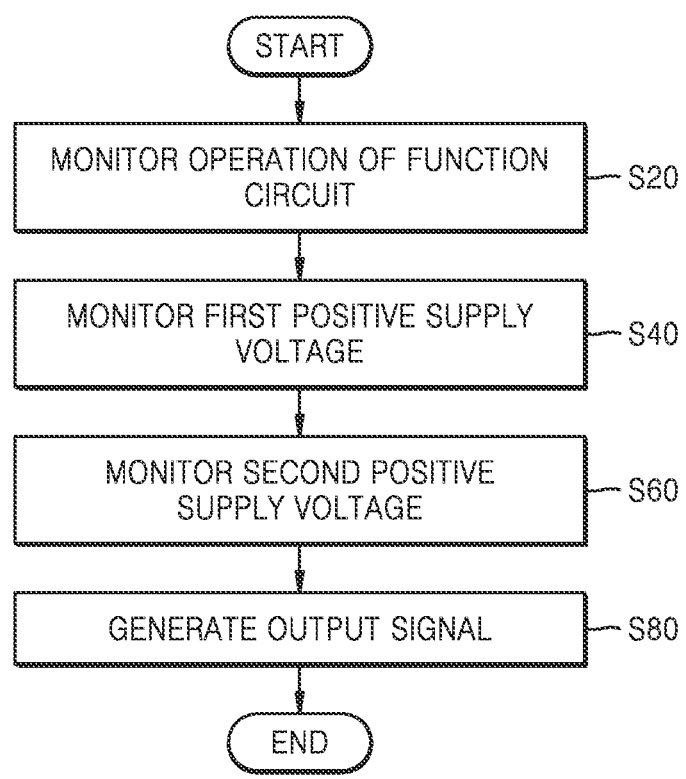
FIG. 11 is a flowchart of a method for outputting a result of monitoring, according to an example embodiment.

FIG. 11 is a flowchart of a method for outputting a result of monitoring, according to an example embodiment. As shown in FIG. 11, the method for outputting a result of monitoring may include a plurality of operations S20, S40, S60, and S80. In some embodiments, the method of FIG. 11 may be performed by the device 10 of FIG. 1. Hereinafter, in a description of FIG. 11, the output circuit 16 of FIG. 1 may be assumed to include the components of the output circuit 20a of FIG. 2A, and FIG. 1 will be described with reference to FIGS. 1 and 2A.

Referring to FIG. 11, in operation S20, an operation of the function circuit 12 may be monitored. For example, the monitoring circuit 14 may detect whether the function circuit 12 normally operates based on the signals SIG provided by the function circuit 12. The monitoring circuit 14 may generate the first monitor signal MNT1 by monitoring the function circuit 12. As described above with reference to FIG. 1, the function circuit 12 may operate based on power provided by the first positive supply voltage VDD1 and the first negative supply voltage VSS1, whereas the monitoring circuit 14 may operate based on power provided by the second positive supply voltage VDD2 and the second negative supply voltage VSS2.

In operation S40 the first positive supply voltage VDD1 may be monitored. In operation S60, the second positive supply voltage VDD2 may be monitored. For example, the output circuit 16 may receive the first positive supply voltage VDD1 and the second positive supply voltage VDD2, and the first power controller 21 included in the output circuit 16 may generate the second monitor signal MNT2 by monitoring the first positive supply voltage VDD1, and may generate the third monitor signal MNT3 by monitoring the second positive supply voltage VDD2.

In operation S80, the output signal OUT may be generated. For example, the output circuit 16 may generate the output signal OUT, based on the first monitor signal MNT1 generated in operation S20 and received from the monitoring circuit 14 and the second monitor signal MNT2 and the third monitor signal MNT3 respectively generated in operation S40 and in operation S60. Accordingly, the output signal OUT may indicate not only a result of the monitoring of the function circuit 12 but also a result of the monitoring of the first positive supply voltage VDD1 and the second positive supply voltage VDD2. An illustration of operation S80 will be described later with reference to FIG. 15.

Figure 12:
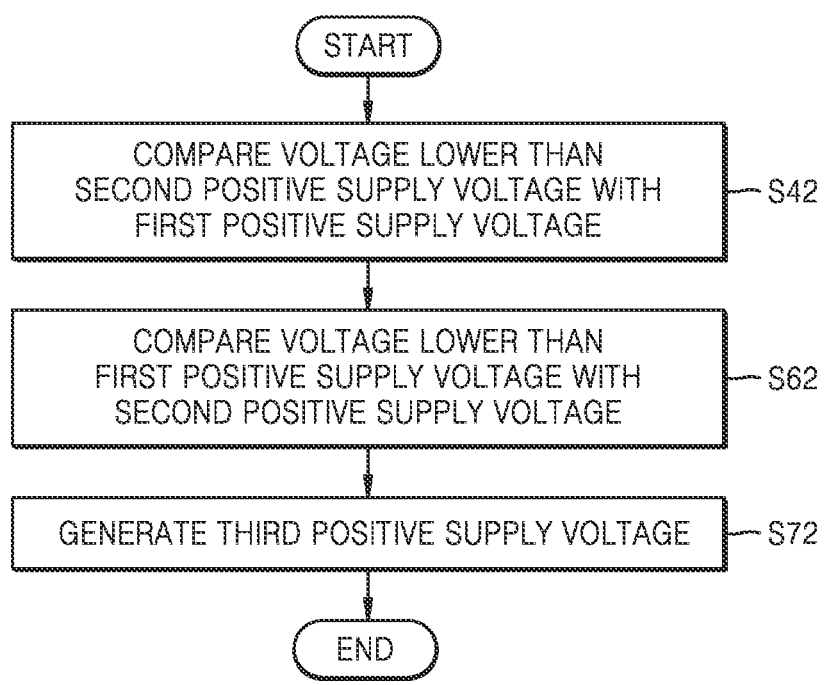
FIG. 12 is a flowchart of a method for outputting a result of monitoring, according to an example embodiment.

FIG. 12 is a flowchart of a method for outputting a result of monitoring, according to an example embodiment. As shown in FIG. 12, the method for outputting a result of monitoring may include a plurality of operations S42, S62, and S72. In some embodiments, operation S42 may be included in operation S40 of FIG. 11, and operation S62 may be included in operation S60 of FIG. 11. In some embodiments, the method of FIG. 12 may be performed by the first power controller 30 of FIG. 3. FIG. 12 will now be described with reference to FIG. 3.

Referring to FIG. 12, in operation S42, the voltage lower than the second positive supply voltage VDD2 may be compared with the first positive supply voltage VDD1. For example, due to the second current source CS32 and the second resistor R32, the non-inverting input of the second comparator C32 may have the voltage that is lower than the second positive supply voltage VDD2. The second comparator C32 may generate the second monitor signal MNT2 by comparing the first positive supply voltage VDD1 applied to the inverting input with the voltage of the non-inverting input. Thus, the second monitor signal MNT2 may indicate a defect (for example, a voltage drop) of the first positive supply voltage VDD1.

In operation S62, the voltage lower than the first positive supply voltage VDD1 may be compared with the second positive supply voltage VDD2. For example, due to the first current source CS31 and the first resistor R31, the non-inverting input of the first comparator C31 may have the voltage that is lower than the first positive supply voltage VDD1. The first comparator C31 may generate the third monitor signal MNT3 by comparing the second positive supply voltage VDD2 applied to the inverting input with the voltage of the non-inverting input. Thus, the third monitor signal MNT3 may indicate a defect (for example, a voltage drop) of the second positive supply voltage VDD2.

In operation S72, the third positive supply voltage VDD3 may be generated. In some embodiments, the first power controller 30 may generate the third positive supply voltage VDD3 from one of the first positive supply voltage VDD1 and the second positive supply voltage VDD2 based on a result of the comparison in operation S42 and/or a result of the comparison in operation S62. For example, as described above with reference to FIG. 3, the third monitor signal MNT3 and the inverted signal of the third monitor signal MNT3 may be provided to the second transistor P32 and the first transistor P31, respectively, and thus, the third positive supply voltage VDD3 may correspond to a voltage having no defects from among the first positive supply voltage VDD1 and the second positive supply voltage VDD2.

Figure 13:
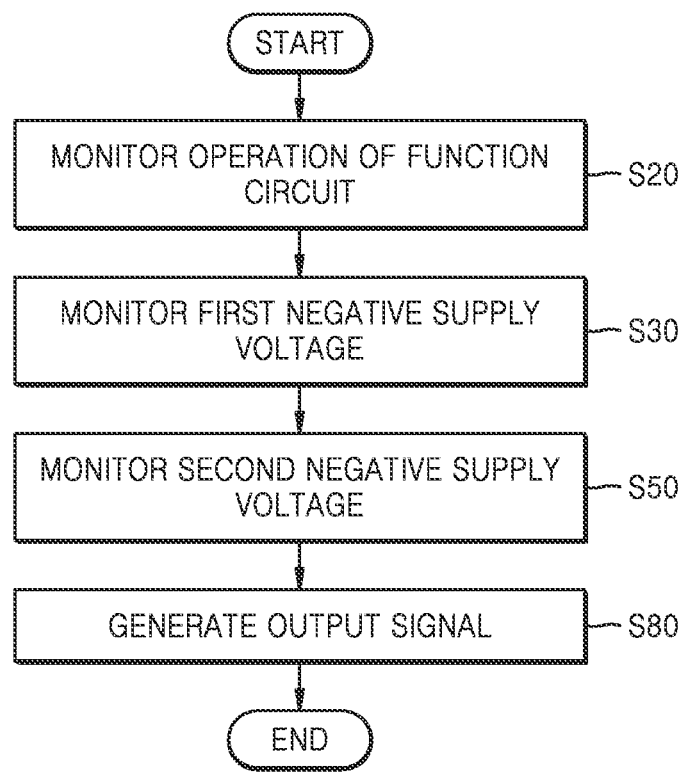
FIG. 13 is a flowchart of a method for outputting a result of monitoring, according to an example embodiment.

FIG. 13 is a flowchart of a method for outputting a result of monitoring, according to an example embodiment. As shown in FIG. 13, the method for outputting a result of monitoring may include operations S20, S30, S50, and S80. In some embodiments, the method of FIG. 13 may be performed by the output circuit 20a of FIG. 2A. FIG. 13 will now be described with reference to FIG. 2A. In FIG. 13, operations S20 and S80 are the same as illustrated in FIG. 11 and thus a repeated description thereof is omitted for conciseness.

Referring to FIG. 13, in operation S30, the first negative supply voltage VSS1 may be monitored, and, in operation S50, the second negative supply voltage VSS2 may be monitored. For example, the output circuit 20a may receive the first negative supply voltage VSS1 and the second negative supply voltage VSS2, and the second power controller 22 may generate the fourth monitor signal MNT4 by monitoring the first negative supply voltage VSS1, and may generate the fifth monitor signal MNT5 by monitoring the second negative supply voltage VSS2.

As described above with reference to FIG. 11, the output circuit 20a may generate the output signal OUT, based on the first monitor signal MNT1 generated by monitoring the function circuit, the second monitor signal MNT2 and the third monitor signal MNT3 generated by monitoring the first positive supply voltage VDD1 and the second positive supply voltage VDD2, and the fourth monitor signal MNT4 and the fifth monitor signal MNT5 generated in operation S30 and operation S50. Accordingly, the output signal OUT may indicate the result of the monitoring of the function circuit 12, the result of the monitoring of the first positive supply voltage VDD1 and the second positive supply voltage VDD2, and the result of the monitoring of the first negative supply voltage VSS1 and the second negative supply voltage VSS2.

Figure 14:
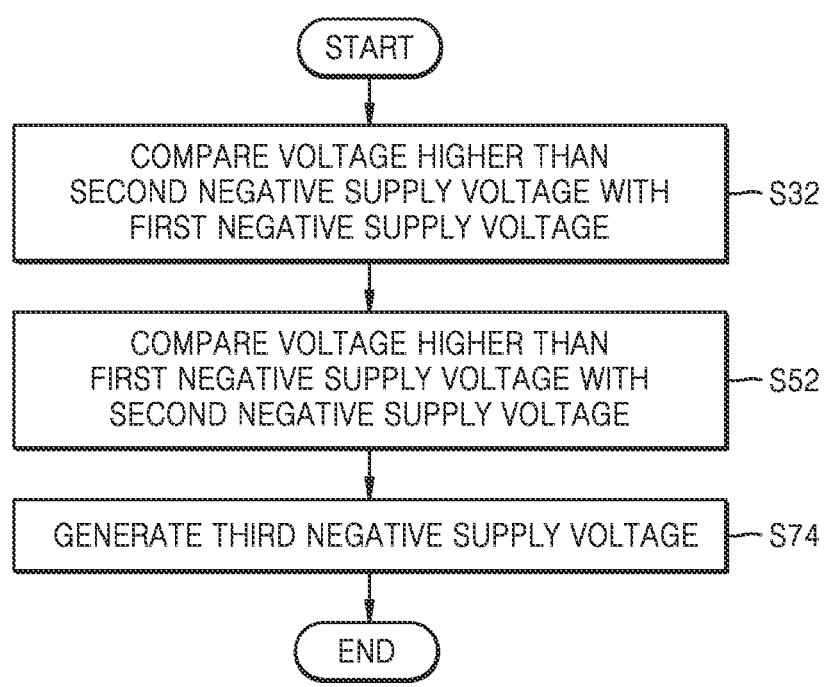
FIG. 14 is a flowchart of a method for outputting a result of monitoring, according to an example embodiment.

FIG. 14 is a flowchart of a method for outputting a result of monitoring, according to an example embodiment. As shown in FIG. 14, the method for outputting a result of monitoring may include a plurality of operations S32, S52, and S74. In some embodiments, operation S32 may be included in operation S30 of FIG. 13, and operation S52 may be included in operation S50 of FIG. 13. In some embodiments, the method of FIG. 14 may be performed by the second power controller 40a of FIG. 4A. FIG. 14 will now be described with reference to FIG. 4A.

Referring to FIG. 14, in operation S32, the voltage higher than the second negative supply voltage VSS2 may be compared with the first negative supply voltage VSS1. For example, due to the second current source CS42 and the second resistor R42, the non-inverting input of the second comparator C42 may have the voltage that is higher than the second negative supply voltage VSS2. The second comparator C42 may generate the fourth monitor signal MNT4 by comparing the first negative supply voltage VSS1 applied to the non-inverting input with the voltage of the inverting input. Thus, the fourth monitor signal MNT4 may indicate a defect (for example, a voltage rise) of the first negative supply voltage VSS1.

In operation S52, the voltage higher than the first negative supply voltage VSS1 may be compared with the second negative supply voltage VSS2. For example, due to the first current source CS41 and the first resistor R41, the non-inverting input of the first comparator C41 may have the voltage that is higher than the first negative supply voltage VSS1. The first comparator C41 may generate the fifth monitor signal MNT5 by comparing the second negative supply voltage VSS2 applied to the non-inverting input with the voltage of the inverting input. Thus, the fifth monitor signal MNT5 may indicate a defect (for example, a voltage rise) of the second negative supply voltage VSS2.

In operation S74, the third positive supply voltage VDD3 may be generated. In some embodiments, the second power controller 40a may generate the third negative supply voltage VSS3 from one of the first negative supply voltage VSS1 and the second negative supply voltage VSS2 based on a result of the comparison in operation S32 and/or a result of the comparison in operation S52. For example, as described above with reference to FIG. 4A, the fifth monitor signal MNT5 and the inverted signal of the fifth monitor signal MNT5 may be provided to the first transistor P41 and the second transistor P42, respectively, and thus, the third negative supply voltage VSS3 may correspond to a voltage having no defects from among the first negative supply voltage VSS1 and the second negative supply voltage VSS2.

Figure 15:
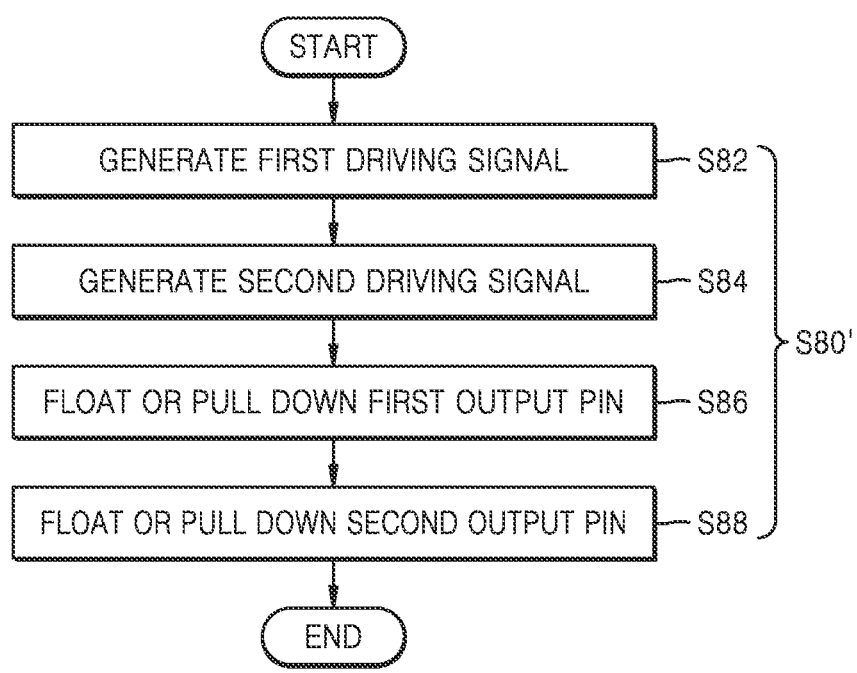
FIG. 15 is a flowchart of a method for outputting a result of monitoring, according to an example embodiment.

FIG. 15 is a flowchart of a method for outputting a result of monitoring, according to an example embodiment. In detail, the flowchart of FIG. 15 illustrates an example of operation S80 of FIG. 11. As described above with reference to FIG. 11, in operation S80' of FIG. 15, the output signal OUT may be generated. As shown in FIG. 15, operation S80' may include a plurality of operations S82, S84, S86, and S88. In some embodiments, operation S80' may be performed by the output circuit 60 of FIG. 6. FIG. 15 will now be described with reference to FIG. 6.

Referring to FIG. 15, in operation S82, the first driving signal DRV1 may be generated. For example, the first output driver 63 may generate the first driving signal DRV1 from at least one monitor signal based on power provided by the third positive supply voltage VDD3 and the third negative supply voltage VSS3. In some embodiments, the first output driver 63 may receive the first monitor signal MNT1, the third monitor signal MNT3, and the fifth monitor signal MNT5. In some embodiments, the first output driver 63 may further receive the second monitor signal MNT2. When at least one of the received monitor signals is activated, the first output driver 63 may generate the activated first driving signal DRV1. Due to the third positive supply voltage VDD3 and the third negative supply voltage VSS3, the first output driver 63 may normally output the first driving signal DRV1 despite a defect occurring in the power sources.

In operation S84, the second driving signal DRV2 may be generated. For example, the second output driver 64 may generate the second driving signal DRV2 from at least one monitor signal based on power provided by the third positive supply voltage VDD3 and the third negative supply voltage VSS3. In some embodiments, the second output driver 64 may receive the first monitor signal MNT1, the second monitor signal MNT2, and the fourth monitor signal MNT4. In some embodiments, the second output driver 64 may further receive the third monitor signal MNT3. When at least one of the received monitor signals is activated, the second output driver 64 may generate the activated second driving signal DRV2. Due to the third positive supply voltage VDD3 and the third negative supply voltage VSS3, the second output driver 64 may normally output the second driving signal DRV2 despite a defect occurring in the power sources.

In operation S86, a first output pin may be floated or pulled down. In operation S88, a second output pin may be floated or pulled down. The first output pin may be an output pin connected to the first switch circuit 67, the second output pin may be an output pin connected to the second switch circuit 68. In some embodiments, as shown in FIG. 6, the first output pin and the second output pin may be the same output pin T to which the first switch circuit 67 and the second switch circuit 68 are commonly connected. In some embodiments, similar to the description given above with reference to FIG. 2B, the first output pin and the second output pin may be two output pins independent from each other.

The first switch circuit 67 may float the first output pin or connect the first output pin to the first pull-down circuit 65 based on the fifth monitor signal MNT5. The first pull-down circuit 65 may float or pull down a node to which the first pull-down circuit 65 and the first switch circuit 67 are connected based on the first driving signal DRV1. Thus, when the fifth monitor signal MNT5 is inactivated and the first driving signal DRV1 is activated, the first output pin may be pulled down, and otherwise, the first output pin may be floated.

The second switch circuit 68 may float the second output pin or connect the second output pin to the second pull-down circuit 66 based on the fourth monitor signal MNT4. The second pull-down circuit 66 may float or pull down a node to which the second pull-down circuit 66 and the second switch circuit 68 are connected based on the second driving signal DRV2. Thus, when the fourth monitor signal MNT4 is inactivated and the second driving signal DRV2 is activated, the second output pin may be pulled down, and otherwise, the second output pin may be floated.

Figure 16:
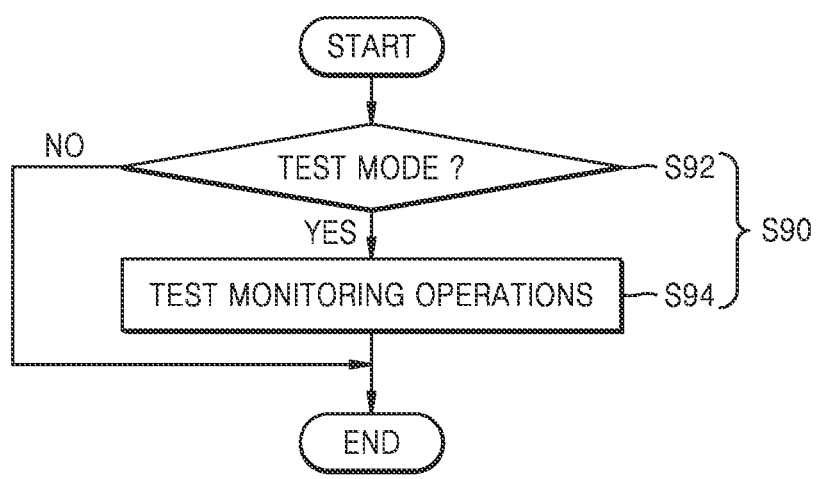
FIG. 16 is a flowchart of a method for testing, according to an example embodiment.

FIG. 16 is a flowchart of a method for testing, according to an example embodiment. In detail, the flowchart of FIG. 16 illustrates operation S90 of performing a BIST operation. As shown in FIG. 16, operation S90 may include operation S92 and operation S94. In some embodiments, operation S90 may be performed by the BIST circuit 88 of FIG. 8. FIG. 16 will now be described with reference to operation S90.

Referring to FIG. 16, in operation S92, an operation mode may be determined. For example, the device 80 may be set to the test mode by initiating supply of power to the device or by control provided from the outside of the device 80. In some embodiments, the BIST circuit 88 may be enabled in the test mode, and may be disabled in a normal mode. As shown in FIG. 16, when the device 80 is set to the test mode, operation S94 may be subsequently performed; otherwise the method may end.

In operation S94, monitoring operations may be tested. For example, the BIST circuit 88 may test a monitoring operation of the monitoring circuit 84, namely, a monitoring operation with respect to the function circuit 82, through the first test signal TST1. The BIST circuit 88 may test a monitoring operation of the output circuit 86, namely, a monitoring operation with respect to supply voltages, through the second test signal TST2. When tests of the monitoring circuit 84 and the output circuit 86 is passed, the BIST circuit 88 may output a signal indicating a pass to the outside of the device 80. On the other hand, when the test of the monitoring circuit 84 and/or the output circuit 86 fail, the BIST circuit 88 may output a signal indicating a failure to the outside of the device 80.

Figure 17:
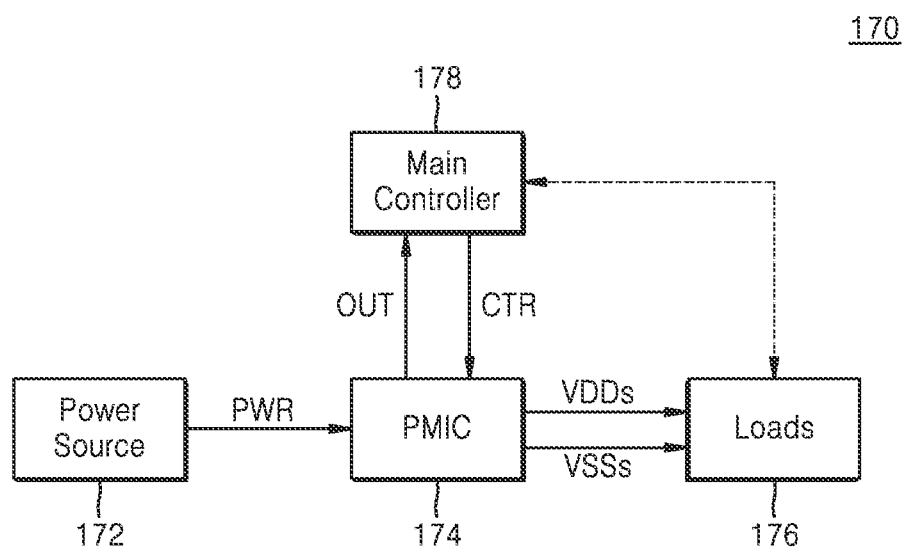
FIG. 17 is a block diagram of a system according to an example embodiment.

FIG. 17 is a block diagram of a system 170 according to an example embodiment. In some embodiments, the system 170 may be the device described above with reference to the drawings, and may include a power management integrated circuit (PMIC) 174. As illustrated in FIG. 17, the system 170 may include a power source 172, the PMIC 174, loads 176, and a main controller 178.

The power source 172 may supply power PWR to the PMIC 174. For example, the power source 172 may supply the power PWR from energy provided from the outside to the system 170, or may supply the power PWR from an energy source included in the power source 172, such as a battery or an internal combustion engine.

The PMIC 174 may provide one or more positive supply voltages VDDs and one or more negative supply voltages VSSs from the power PWR received from the power source 172 to the loads 176. For example, the PMIC 174 may include at least one voltage generator such as a switching converter and a low dropout (LDO) regulator. As shown in FIG. 17, the PMIC 174 may receive a control signal CTR from the main controller 178, and may generate the one or more positive supply voltages VDDs and the one or more negative supply voltages VSSs based on the control signal CTR. The PMIC 174 may detect the one or more positive supply voltages VDDs, the one or more negative supply voltages VSSs, or signals generated inside, and may provide information corresponding to a result of the detection to the main controller 178.

The PMIC 174 may generate the output signal OUT by monitoring operations of the PMIC 174. For example, the PMIC 174 may include a monitoring circuit, and the monitoring circuit may monitor a function circuit of the PMIC 174, for example, an operation of a voltage generator. The PMIC 174 may also include an output circuit, and the output circuit may generate the output signal OUT based on not only a result of the monitoring by the monitoring circuit but also a result of monitoring the supply voltages used to generate the output signal OUT. The output signal OUT may be normally generated despite a defect occurring in the supply voltages.

The main controller 178 may control the system 170. As shown in FIG. 17, the main controller 178 may provide the control signal CTR to the PMIC 174, and may receive the output signal OUT from the PMIC 174. The main controller 178 may determine whether the PMIC 174 normally operates based on the output signal OUT. For example, when the PMIC 174 does not normally operates, namely, when the output signal OUT is activated, the main controller 178 may perform suitable subsequent operations, such as outputting a signal to a user of the system 170 or stopping at least one of the functions performed by the loads 176. The main controller 178 may include a programmable component such as a central processing unit (CPU); a reconfigurable component such as a field programmable gate array (FPGA); or a component designed to perform a fixed function, such as an intellectual property (IP) core.

The loads 176 may receive the one or more positive supply voltages VDDs and the one or more negative supply voltages VSSs from the PMIC 174, may operate based on power provided by the one or more positive supply voltages VDDs and the one or more negative supply voltages VSSs, and may perform designed functions. In some embodiments, the main controller 178 may be included in the loads 176.

While various embodiments have been particularly shown and described with reference to the drawings, it will be understood that various changes in form and details may be made therein without departing from the spirit and scope of the following claims.

What is claimed is:

1. A device comprising:
a function circuit configured to receive power provided by a first positive supply voltage and a first negative supply voltage to perform at least one function provided by the device and to output a signal;
a monitoring circuit configured to receive power provided by a second positive supply voltage and a second negative supply voltage, and generate a first monitor signal based on monitoring an operation of the function circuit based on the signal from the function circuit; and
an output circuit configured to generate a second monitor signal based on monitoring the first positive supply voltage, generate a third monitor signal based on monitoring the second positive supply voltage, and generate an output signal that is output through at least one output pin of the device based on the first monitor signal, the second monitor signal, and the third monitor signal.

2. The device of claim 1, wherein the output circuit comprises a first power controller configured to:
generate the second monitor signal and the third monitor signal, and
generate a third positive supply voltage from one of the first positive supply voltage and the second positive supply voltage, based on at least one of the second monitor signal and the third monitor signal.

3. The device of claim 2, wherein the first power controller comprises:
a first comparator configured to receive power provided by the third positive supply voltage and the second negative supply voltage, and generate the third monitor signal by comparing a voltage lower than the first positive supply voltage with the second positive supply voltage; and a second comparator configured to receive power provided by the third positive supply voltage and the first negative supply voltage, and generate the second monitor signal by comparing a voltage lower than the second positive supply voltage with the first positive supply voltage.

4. The device of claim 2, wherein the output circuit further comprises a second power controller configured to:

generate a fourth monitor signal by monitoring the first negative supply voltage, generate a fifth monitor signal by monitoring the second negative supply voltage, and generate a third negative supply voltage from one of the first negative supply voltage and the second negative supply voltage, based on at least one of the fourth monitor signal and the fifth monitor signal, and wherein the output circuit is configured to output the output signal to outside of the device, based on the first monitor signal, the second monitor signal, the third monitor signal, the fourth monitor signal, and the fifth monitor signal.

5. The device of claim 4, wherein the second power controller comprises:

a third comparator configured to receive power provided by the third positive supply voltage and the third negative supply voltage, and generate the fifth monitor signal by comparing a voltage higher than the first negative supply voltage with the second negative supply voltage; and a fourth comparator configured to receive power provided by the third positive supply voltage and the third negative supply voltage, and generate the fourth monitor signal by comparing a voltage higher than the second negative supply voltage with the first negative supply voltage.

6. The device of claim 4, wherein the output circuit further comprises:

a first output driver configured to receive power provided by the third positive supply voltage and the third negative supply voltage, and to generate a first driving signal based on the first monitor signal, the third monitor signal, and the fifth monitor signal;

a second output driver configured to receive the power provided by the third positive supply voltage and the third negative supply voltage, and to generate a second driving signal based on the first monitor signal, the second monitor signal, and the fourth monitor signal;

a first pull-down circuit configured to pull down a first node connected to one of the at least one output pin to the first negative supply voltage based on the first driving signal; and a second pull-down circuit configured to pull down a second node connected to one of the at least one output pin to the second negative supply voltage based on the second driving signal.

7. The device of claim 6, wherein the output circuit further comprises:

a first switch circuit configured to electrically connect or disconnect the first pull-down circuit to or from the first node based on the fourth monitor signal; and a second switch circuit configured to electrically connect or disconnect the second pull-down circuit to or from the second node based on the fifth monitor signal.

8. The device of claim 7, wherein the first node and the second node are electrically connected to each other.

9. The device of claim 1, further comprising a built-in self-test (BIST) circuit configured to operate based on power provided by the first positive supply voltage and test the monitoring circuit and the output circuit in a test mode.

10. A device comprising:

a function circuit configured to receive power provided by a first positive supply voltage and a first negative supply voltage to perform at least one function of the device and to output a signal;

a monitoring circuit configured to receive power provided by a second positive supply voltage and a second negative supply voltage and generate a first monitor signal based on monitoring an operation of the function circuit based on the signal from the function circuit; and an output circuit configured to generate a third positive supply voltage from one of the first positive supply voltage and the second positive supply voltage, and generate an output signal that is output from the device through at least one output pin, the output signal being generated from the first monitor signal based on power provided by the third positive supply voltage.

11. The device of claim 10, wherein the output circuit is configured to generate a third negative supply voltage from one of the first negative supply voltage and the second negative supply voltage, and generate the output signal from the first monitor signal based on power provided by the third positive supply voltage and the third negative supply voltage.

12. The device of claim 11, wherein the output circuit further comprises:

a first output driver configured to receive the power provided by the third positive supply voltage and the third negative supply voltage, and to generate a first driving signal based on the first monitor signal;

a second output driver configured to receive the power provided by the third positive supply voltage and the third negative supply voltage, and to generate a second driving signal based on the first monitor signal;

a first pull-down circuit configured to pull down a first node connected to one of the at least one output pin to the first negative supply voltage based on the first driving signal; and a second pull-down circuit configured to pull down a second node connected to one of the at least one output pin to the second negative supply voltage based on the second driving signal.

13. The device of claim 12, wherein the first node and the second node are electrically connected to each other.

14. A method comprising:

generating, by a monitoring circuit, a first monitor signal based on monitoring an operation of a function circuit;

generating, by an output circuit, a second monitor signal based on monitoring a first positive supply voltage provided to the function circuit;

generating, by the output circuit, a third monitor signal based on monitoring a second positive supply voltage provided to the monitoring circuit; and generating, by the output circuit, an output signal that is output through at least one output pin of a device, based on the first monitor signal, the second monitor signal, and the third monitor signal.

15. The method of claim 14, further comprising generating a third positive supply voltage based on at least one of the second monitor signal and the third monitor signal, wherein the generating of the second monitor signal comprises comparing a voltage lower than the second positive supply voltage with the first positive supply voltage, based on power provided by the third positive supply voltage, and the generating of the third monitor signal comprises comparing a voltage lower than the first positive supply voltage with the second positive supply voltage, based on the power provided by the third positive supply voltage.

16. The method of claim 15, further comprising:

generating a fourth monitor signal by monitoring a first negative supply voltage provided to the function circuit; and generating a fifth monitor signal by monitoring a second negative supply voltage provided to the monitoring circuit, wherein the generating of the output signal comprises generating the output signal, based on the first monitor signal, the second monitor signal, the third monitor signal, the fourth monitor signal, and the fifth monitor signal.

17. The method of claim 16, further comprising generating a third negative supply voltage based on at least one of the fourth monitor signal and the fifth monitor signal, wherein the generating of the fourth monitor signal comprises comparing a voltage higher than the second negative supply voltage with the first negative supply voltage, based on power provided by the third positive supply voltage and the third negative supply voltage, and the generating of the fifth monitor signal comprises comparing a voltage higher than the first negative supply voltage with the second negative supply voltage, based on the power provided by the third positive supply voltage and the third negative supply voltage.

18. The method of claim 17, wherein the generating of the output signal further comprises:

generating a first driving signal from the first monitor signal, the third monitor signal, and the fifth monitor signal, based on the power provided by the third positive supply voltage and the third negative supply voltage;

generating a second driving signal from the first monitor signal, the second monitor signal, and the fourth monitor signal, based on the power provided by the third positive supply voltage and the third negative supply voltage;

pulling down a first node connected to one of the at least one output pin to the first negative supply voltage based on the first driving signal; and pulling down a second node connected to one of the at least one output pin to the second negative supply voltage based on the second driving signal.

19. The method of claim 18, wherein the generating of the output signal further comprises:

floating the first node based on the fourth monitor signal; and floating the second node based on the fifth monitor signal.

20. The method of claim 18, wherein the first node and the second node are electrically connected to each other.

* * * * *